(12) United States Patent
Park et al.

(10) Patent No.: US 7,534,723 B2
(45) Date of Patent: May 19, 2009

(54) METHODS OF FORMING FINE PATTERNS, AND METHODS OF FORMING TRENCH ISOLATION LAYERS USING THE SAME

(75) Inventors: Jae-Hyun Park, Gyeonggi-do (KR); Jae-Hee Oh, Gyeonggi-do (KR); Se-Ho Lee, Seoul (KR); Won-Cheol Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 170 days.

(21) Appl. No.: 11/519,081

(22) Filed: Sep. 11, 2006

(65) Prior Publication Data
US 2007/0059934 A1 Mar. 15, 2007

(30) Foreign Application Priority Data
Sep. 12, 2005 (KR) .................. 10-2005-0084861

(51) Int. Cl.
*H01L 21/76* (2006.01)
*H01L 21/027* (2006.01)
*H01L 21/033* (2006.01)
*C03C 25/68* (2006.01)
*C23F 1/00* (2006.01)
*H01L 21/302* (2006.01)
*H01L 21/461* (2006.01)

(52) U.S. Cl. ............. 438/669; 438/405; 438/427; 438/445; 438/734; 438/736; 216/47; 257/E21.023; 257/E21.035

(58) Field of Classification Search ............. 438/734, 438/736, 299, 386, 404, 405, 427, 444, 445; 216/47; 257/E21.023, E21.035
See application file for complete search history.

(56) References Cited

U.S. PATENT DOCUMENTS
5,686,223 A 11/1997 Cleeves .................. 430/312

(Continued)

FOREIGN PATENT DOCUMENTS
JP 11-195702 7/1999

(Continued)

OTHER PUBLICATIONS

Franssila, "Introduction to Microfabrication." 2004, Wiley & Sons, Ltd., pp. 193.*

(Continued)

*Primary Examiner*—Alexander G Ghyka
*Assistant Examiner*—Leonard Chang
(74) *Attorney, Agent, or Firm*—Myers Bigel Sibley & Sajovec

(57) ABSTRACT

Methods of forming a fine pattern include forming an underlying layer on a substrate, forming preliminary hard mask patterns having a first pitch on the underlying layer, the preliminary hard mask patterns having a first width and being spaced apart from each other by a second width smaller than the first width. The underlying layer is etched using the preliminary hard mask patterns as etch masks to thereby form preliminary underlying patterns. The preliminary hard mask patterns are pulled back, thereby forming hard mask patterns on the preliminary underlying patterns. An overlayer is formed on the substrate exposing top surfaces of the hard mask patterns. The hard mask patterns and the preliminary underlying patterns disposed below the hard mask patterns are etched using the overlayer as an etch mask, thereby forming underlying patterns having a second pitch smaller than the first pitch, and the overlayer is removed.

11 Claims, 17 Drawing Sheets

U.S. PATENT DOCUMENTS

| | | | |
|---|---|---|---|
| 5,817,568 A | 10/1998 | Chao | 438/427 |
| 6,461,934 B2 | 10/2002 | Nishida et al. | 438/424 |
| 6,624,016 B2 * | 9/2003 | Wu | 438/221 |

FOREIGN PATENT DOCUMENTS

| | | |
|---|---|---|
| JP | 11-330462 | 11/1999 |
| JP | 2003-309108 | 10/2003 |
| KR | 1020010039011 A | 5/2001 |
| KR | 1020020034471 A | 5/2002 |

OTHER PUBLICATIONS

Holland et al., "Advanced Groundrule Processing Performed with Currently Available Photolithographic Tools", Feb. 1987, IBM Technical Disclosure Bulletin vol. 29 No. 9, pp. 3928-3929.*

* cited by examiner

METHODS OF FORMING FINE PATTERNS, AND METHODS OF FORMING TRENCH ISOLATION LAYERS USING THE SAME

CROSS-REFERENCE TO RELATED APPLICATION

This application claims priority under 35 U.S.C. § 119 to Korean Patent Application No. 10-2005-0084861, filed on Sep. 12, 2005, the disclosure of which is hereby incorporated herein by reference in its entirety.

FIELD OF THE INVENTION

The present invention relates to methods of fabricating a semiconductor device, and more particularly, to methods of forming fine patterns, and methods of forming trench isolation layers using the same.

BACKGROUND

As the integration density (e.g. the number of features per square unit area) of semiconductor devices continues to increase, methods of increasing the pattern resolution during exposure of a semiconductor substrate using a photolithographic mask are desirable. Resolution may be determined based on the well-known Rayleigh's equation. Light sources having shorter wavelengths have been investigated to increase resolution. For example, photolithography processes have progressed from using emissions at the G-line at 436 nm of an Hg source, to the I-line at 365 nm of an Hg source, followed by a KrF laser of 248 nm, then an ArF laser of 193 nm, and presently an $F_2$ laser of 157 nm as the light source. In addition, processes using X-rays and/or electron beams as the light sources are under development. Development of short-wavelength light sources and corresponding photoresist materials, while costly, has helped increase the integration density of semiconductor devices.

A method of forming a fine pattern is disclosed in U.S. Pat. No. 5,686,223 entitled "Method for Reduced Pitch Lithography" to Cleeves. According to Cleeves, first and second photoresist patterns are formed by performing a photo process twice. In particular, after a first photoresist pattern is formed on a substrate by a first photo process and then stabilized, a second photoresist pattern is formed on the substrate having the first photoresist pattern. However, when the second photoresist pattern is formed by the second photo process, it may be misaligned. In particular, a problem may occur when photoresist patterns are required to be spaced apart from each other by a uniform distance.

In order to make a discrete device perform its own function without interfering with adjacent devices, it is desirable to utilize an isolation technique to electrically and structurally isolate the discrete devices. To increase integration density, it is desirable to reduce not only the dimensions of the discrete devices, but also the area and width of isolation regions between devices. The isolation technique may affect integration density, and may be important to the reliable electrical performance of the device. The trench isolation technique is widely used in semiconductor device fabrication, and has the advantage of avoiding the "bird's beak" problem that may occur when a conventional local oxidation of silicon (LOCOS) process is used for isolation. The trench isolation technique includes forming a hard mask pattern that exposes a field region and covers an active region on a semiconductor substrate, etching the substrate within the field region using the hard mask pattern as an etch mask to form a trench, and filling the trench with an insulating material to form an isolation structure between devices. However, as integration density increases, it may be desirable to reduce the pitch of the hard mask pattern. The pitch of the photoresist pattern may be reduced in order to form a hard mask pattern having a reduced pitch. Accordingly, it may be desirable to use photolithography equipment having a short wavelength light source, along with a corresponding photoresist material. However, the development of new photolithography equipment to replace that used in conventional processes may be costly and/or time-consuming.

SUMMARY

Methods of forming a fine pattern according to some embodiments of the invention include forming an underlying layer on a substrate, forming preliminary hard mask patterns having a first pitch on the underlying layer. Each of the preliminary hard mask patterns may have a first width and may be spaced apart from each other by a second width smaller than the first width. The methods may further include etching the underlying layer using the preliminary hard mask patterns as etch masks to thereby form preliminary underlying patterns. The preliminary hard mask patterns are pulled back, thereby forming hard mask patterns on the preliminary underlying patterns. An overlayer is formed on the substrate exposing top surfaces of the hard mask patterns. The hard mask patterns and the preliminary underlying patterns disposed below the hard mask patterns are etched using the overlayer as an etch mask, thereby forming underlying patterns having a second pitch smaller than the first pitch, and the overlayer is removed.

Forming the preliminary hard mask patterns may include forming a hard mask layer on the underlying layer, forming preliminary photoresist patterns having a first pitch on the hard mask layer, and increasing widths of the preliminary photoresist patterns to thereby form photoresist patterns having a first width. The photoresist patterns are spaced apart from each other by a second width smaller than the first width. The hard mask layer is etched using the photoresist patterns as etch masks, and the photoresist patterns are removed. Increasing widths of the photoresist patterns may include annealing the preliminary photoresist patterns in a photo flow technique.

Forming the preliminary hard mask patterns may include forming a hard mask layer on the underlying layer, and forming sacrificial masks having a first pitch on the hard mask layer. The sacrificial masks may be formed of a material having an etch selectivity with respect to the hard mask layer, spacers may be formed on sidewalls of the sacrificial masks. Layers including the sacrificial masks and the spacers may have a first width and may be spaced apart from each other by a second width smaller than the first width. The hard mask layer is etched using the sacrificial masks and the spacers as etch masks, and the sacrificial masks and the spacers are removed.

Pulling back the preliminary hard mask patterns may include isotropically etching the preliminary hard mask patterns to reduce widths of the preliminary hard mask patterns.

Forming the overlayer may include forming a material layer on the substrate having the hard mask patterns, and planarizing the material layer by a chemical mechanical polishing (CMP) technique until top surfaces of the hard mask patterns are exposed.

The methods may further include etching the substrate using the underlying patterns as etch masks to thereby form trenches, and forming trench isolation layers filling the trenches.

Forming the preliminary hard mask patterns may include forming a hard mask layer on the underlying layer, forming preliminary photoresist patterns having a first pitch on the hard mask layer, and increasing widths of the preliminary photoresist patterns to thereby form photoresist patterns having a first width. The photoresist patterns may be spaced apart from each other by a second width smaller than the first width. The hard mask layer is etched using the photoresist patterns as etch masks, and removing the photoresist patterns.

Forming the preliminary hard mask patterns may include forming a hard mask layer on the underlying layer, forming sacrificial masks having a first pitch on the hard mask layer, the sacrificial masks being formed of a material having an etch selectivity with respect to the hard mask layer, and forming spacers on sidewalls of the sacrificial masks. Layers including the sacrificial masks and the spacers may have a first width and may be spaced apart from each other by a second width smaller than the first width. The hard mask layer is etched using the sacrificial masks and the spacers as etch masks, and the sacrificial masks and the spacers are removed.

Pulling back the preliminary hard mask patterns may include isotropically etching the preliminary hard mask patterns to reduce widths of the preliminary hard mask patterns.

Forming the trench isolation layers may include forming a preliminary trench isolation layer on the substrate having the trench, and planarizing the preliminary trench isolation layer until top surfaces of the underlying patterns are exposed.

The methods may further include after the formation of the trench isolation layers, removing the underlying patterns.

Methods of forming a trench isolation layer according to some embodiments of the invention include forming preliminary hard mask patterns on a substrate, respective ones of the preliminary hard mask patterns having a first width and being spaced apart from each other by a second width smaller than the first width, etching the substrate using the preliminary hard mask patterns as etch masks, thereby forming first trenches, and pulling back the preliminary hard mask patterns to form hard mask patterns on the substrate. The methods further include forming a first preliminary trench isolation layer on the substrate having the hard mask patterns, the first preliminary trench isolation layer exposing top surfaces of the hard mask patterns, and sequentially etching the hard mask patterns and the substrate disposed below the hard mask patterns using the first preliminary trench isolation layer as an etch mask, to thereby form second trenches in the substrate. A second preliminary trench isolation layer is formed on the substrate, and the first and second preliminary trench isolation layers are planarized to thereby form first and second trench isolation layers filling the first and second trenches, respectively.

Forming the preliminary hard mask patterns may include forming a hard mask layer on the substrate, forming preliminary photoresist patterns having a first pitch on the hard mask layer, and increasing the widths of the preliminary photoresist patterns to thereby form photoresist patterns having a first width. The photoresist patterns are spaced apart from each other by a second width smaller than the first width. The hard mask layer is etched using the photoresist patterns as etch masks, and removing the photoresist patterns.

Forming the preliminary hard mask patterns may include forming a hard mask layer on the substrate, forming sacrificial masks having a first pitch on the hard mask layer, the sacrificial masks being formed of a material having an etch selectivity with respect to the hard mask layer, and forming spacers on sidewalls of the sacrificial masks. Layers including the sacrificial masks and the spacers may have a first width and may be spaced apart from each other by a second width smaller than the first width. The hard mask layer is etched using the sacrificial masks and the spacers as etch masks, and the sacrificial masks and the spacers are removed.

Pulling back the preliminary hard mask patterns may include isotropically etching the preliminary hard mask patterns to reduce the widths of the preliminary hard mask patterns.

Methods of forming a trench isolation layer according to further embodiments of the invention include forming preliminary hard mask patterns having a first width and spaced apart from each other by a second width smaller than the first width on a substrate, the preliminary hard mask patterns including a lower preliminary hard mask pattern and an upper preliminary hard mask pattern which are sequentially stacked on the substrate. The methods further include etching the substrate using the upper preliminary hard mask patterns as etch masks, thereby forming first trenches, pulling back the upper preliminary hard mask patterns, thereby forming upper hard mask patterns on the lower preliminary hard mask patterns, and forming a first preliminary trench isolation layer on the substrate having the upper hard mask patterns, the first preliminary trench isolation layer exposing top surfaces of the upper hard mask patterns. The methods further include sequentially etching the upper hard mask patterns, the lower preliminary hard mask patterns disposed below the upper hard mask patterns, and the substrate using the first preliminary trench isolation layer as an etch mask, thereby forming second trenches within the substrate. A second preliminary trench isolation layer may be formed on the substrate having the second trenches, and the first and second preliminary trench isolation layers may be planarized, thereby forming first and second trench isolation layers filling the first and second trenches, respectively.

Forming the lower and upper preliminary hard mask patterns may include forming lower and upper hard mask layers sequentially stacked on the substrate, the upper hard mask layer being formed of a material having an etch selectivity with respect to the lower hard mask layer. Preliminary photoresist patterns having a first pitch may be formed on the upper hard mask layer, and photoresist patterns having a first width may be formed by increasing widths of the preliminary photoresist patterns. The photoresist patterns may be spaced apart from each other by a second width smaller than the first width. The upper and lower hard mask layers are etched using the photoresist patterns as etch masks, and the photoresist patterns are removed.

Forming the lower and upper preliminary hard mask patterns may include forming lower and upper hard mask layers sequentially stacked on the substrate, the upper hard mask layer being formed of a material layer having an etch selectivity with respect to the lower hard mask layer. Sacrificial masks having a first pitch may be formed on the upper hard mask layer, the sacrificial masks being formed of a material having an etch selectivity with respect to the upper hard mask layer. Spacers may be formed on sidewalls of the sacrificial masks. Layers including the sacrificial masks and the spacers may have a first width and may be spaced apart from each other by a second width smaller than the first width. The upper and lower hard mask layers are etched using the sacrificial masks and the spacers as etch masks, and the sacrificial masks and the spacers are removed.

Pulling back the upper preliminary hard mask patterns may include isotropically etching the upper preliminary hard mask patterns to reduce widths of the upper preliminary hard mask patterns.

Methods of forming a trench isolation layer according to still further embodiments of the invention include forming masks having a first width and spaced apart from each other by a second width smaller than the first width on a substrate. Each of the masks may include a lower preliminary hard mask pattern, a preliminary buffer insulating pattern, and an upper preliminary hard mask pattern which are sequentially stacked on the substrate. The methods further include forming first preliminary insulating spacers on sidewalls of the masks, etching the substrate using the upper preliminary hard mask patterns and the first preliminary insulating spacers as etch masks to form first trenches. Predetermined regions of the first preliminary insulating spacers may be etched to form first insulating spacers exposing sidewalls of the upper preliminary hard mask patterns during the formation of the first trenches. The upper preliminary hard mask patterns are pulled back to thereby form upper hard mask patterns on the preliminary buffer insulating patterns, and a first preliminary trench isolation layer is formed on the substrate having the upper hard mask patterns. The first preliminary trench isolation layer may expose top surfaces of the upper hard mask patterns.

The methods further include sequentially etching the upper hard mask patterns, the preliminary buffer insulating patterns disposed below the upper hard mask patterns, the lower preliminary hard mask patterns, and the substrate using the first preliminary trench isolation layer as an etch mask, thereby forming second trenches within the substrate. A second preliminary trench isolation layer may be formed on the substrate having the second trenches, and the first and second preliminary trench isolation layers may be planarized, thereby forming first and second trench isolation layers filling the first and second trenches, respectively.

Forming the masks may include forming a lower hard mask layer, a buffer insulating layer, and an upper hard mask layer sequentially stacked on the substrate. The upper hard mask layer may be formed of a material layer having an etch selectivity with respect to the buffer insulating layer. Preliminary photoresist patterns having a first pitch may be formed on the upper hard mask layer, and widths of the preliminary photoresist patterns may be increased to thereby form photoresist patterns having a first width. The photoresist patterns are spaced apart from each other by a second width smaller than the first width. The upper hard mask layer, the buffer insulating layer, and the lower hard mask layer are sequentially etched using the photoresist patterns as etch masks, and the photoresist patterns are removed.

Forming the masks may include forming a lower hard mask layer, a buffer insulating layer, and an upper hard mask layer sequentially stacked on the substrate. The upper hard mask layer may be formed of a material layer having an etch selectivity with respect to the buffer insulating layer. Sacrificial masks having a first pitch may be formed on the upper hard mask layer, the sacrificial masks being formed of a material having an etch selectivity with respect to the upper hard mask layer. Spacers may be formed on sidewalls of the sacrificial masks. Layers including the sacrificial masks and the spacers have a first width and are spaced apart from each other by a second width smaller than the first width. The upper hard mask layer, the buffer insulating layer, and the lower hard mask layer are etched using the sacrificial masks and the spacers as etch masks, and the sacrificial masks and the spacers are removed.

The first preliminary insulating spacers may be formed of a material having an etch selectivity with respect to the upper preliminary hard mask patterns.

The lower preliminary hard mask patterns and the upper preliminary hard mask patterns may be formed of nitride layers.

The first insulating spacer may expose sidewalls of the upper preliminary hard mask patterns while at least partially covering sidewalls of the lower preliminary hard mask patterns.

The methods may further include, after etching the upper hard mask patterns, the preliminary buffer insulating patterns, and the lower preliminary hard mask patterns using the first preliminary trench isolation layer as an etch mask, forming a second insulating spacer on the exposed sidewalls of the remaining lower preliminary hard mask patterns and the preliminary buffer insulating patterns as well as on the exposed sidewall of the first preliminary trench isolation layer.

Forming the first and second trench isolation layers may include planarizing the first and second preliminary trench isolation layers using a chemical mechanical polishing technique until a top surface of the remaining lower preliminary hard mask pattern may be exposed.

The first and second trench isolation layers may include protrusions having top surfaces higher than a top surface of the substrate.

The first and second insulating spacers may remain to cover sidewalls of the protrusions of the first and second trench isolation layers, respectively, during the formation of the first and second trench isolation layers.

The methods may further include after the formation of the first and second trench isolation layers, removing the remaining lower preliminary hard mask pattern.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
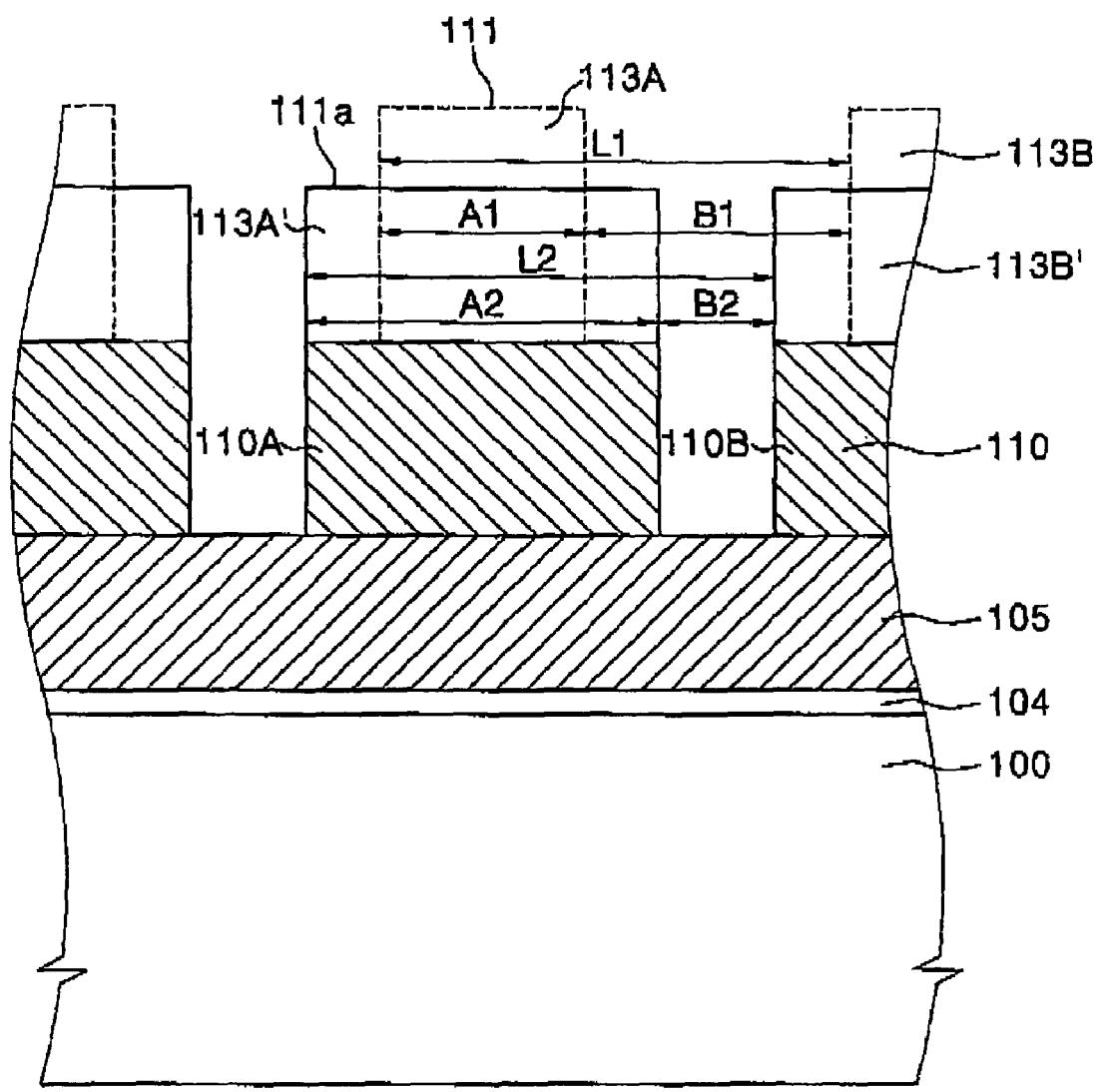
FIGS. 1A to 1E are cross-sectional views illustrating methods of forming a fine pattern in accordance with some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 1B:
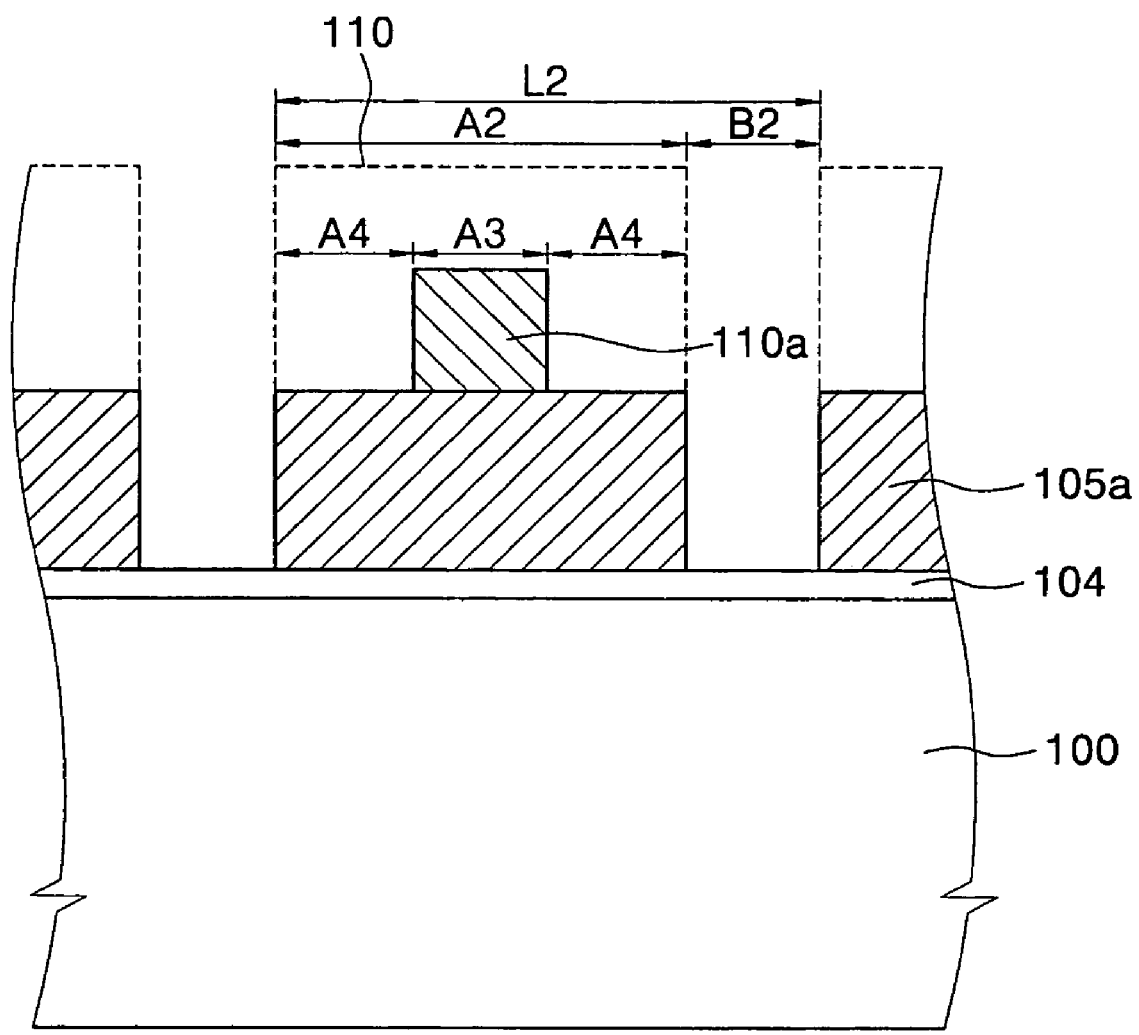
Figure 1C:
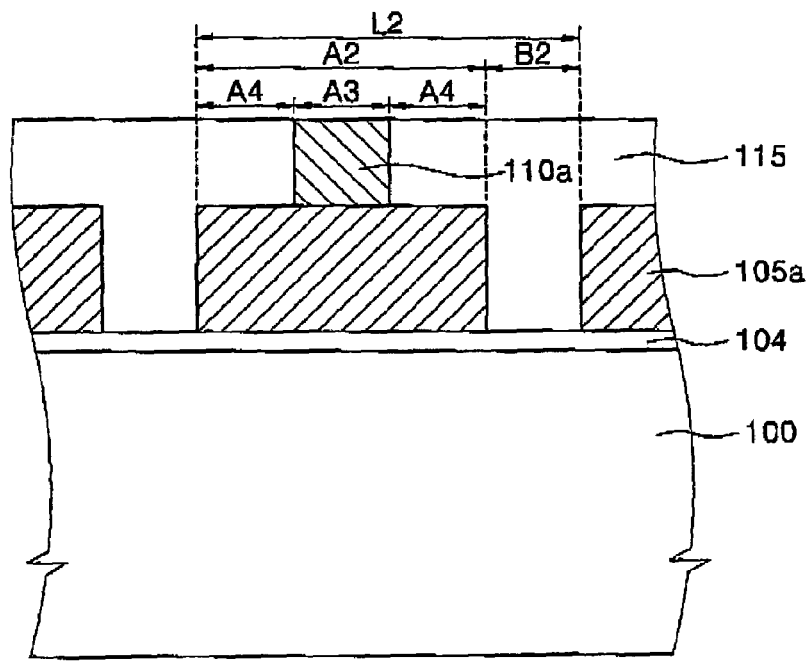
Figure 1D:
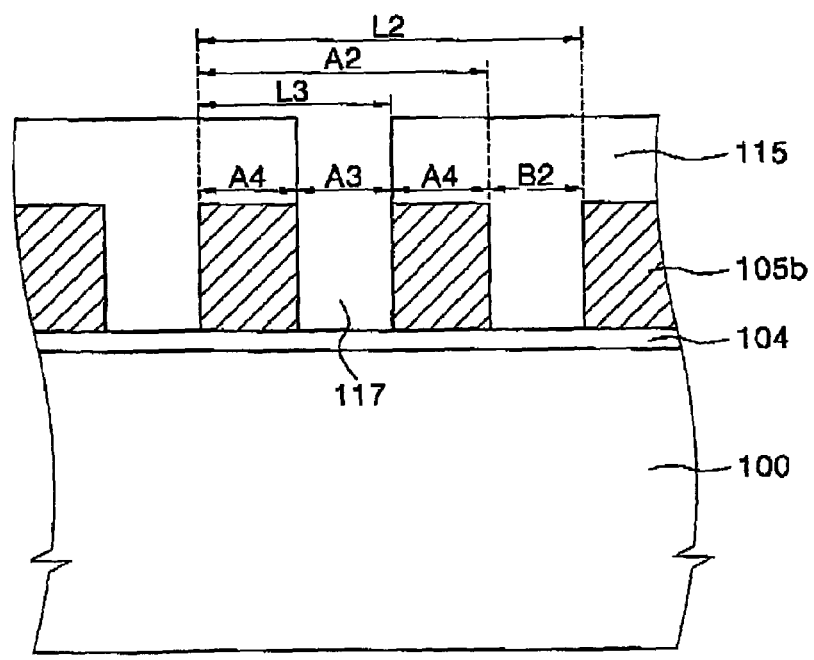
Figure 1E:
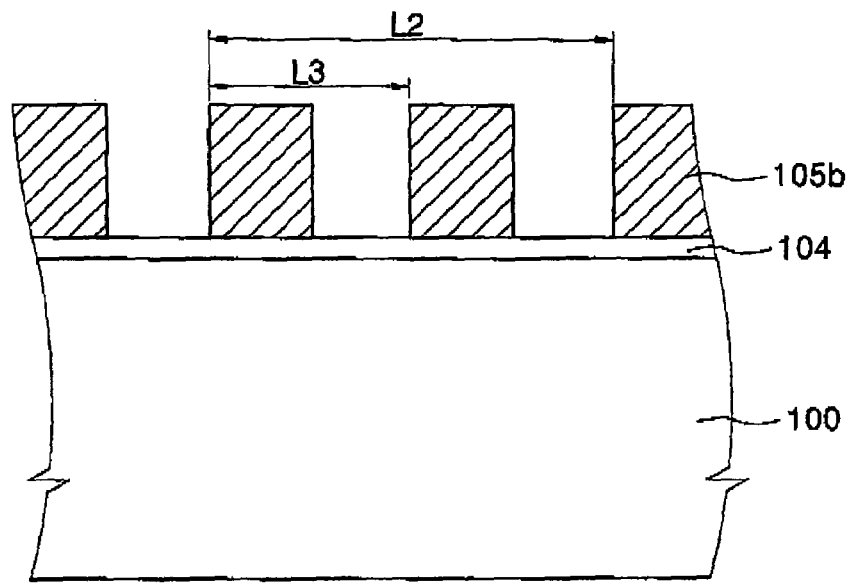
Figure 1F:
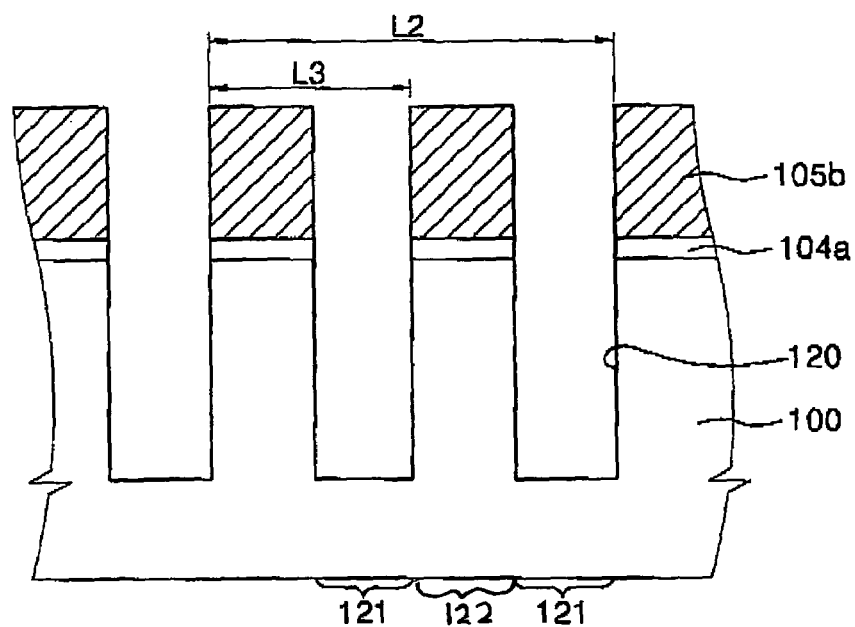
FIGS. 1F to 1H are cross-sectional views illustrating methods of forming a trench isolation layer using methods of forming a fine pattern in accordance with some embodiments of the present invention.
Figure 1G:
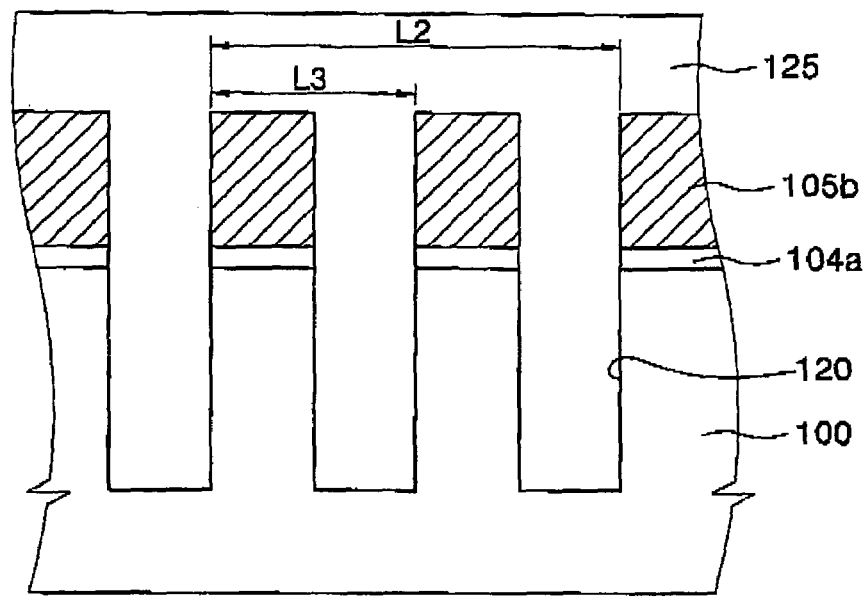
Figure 1H:
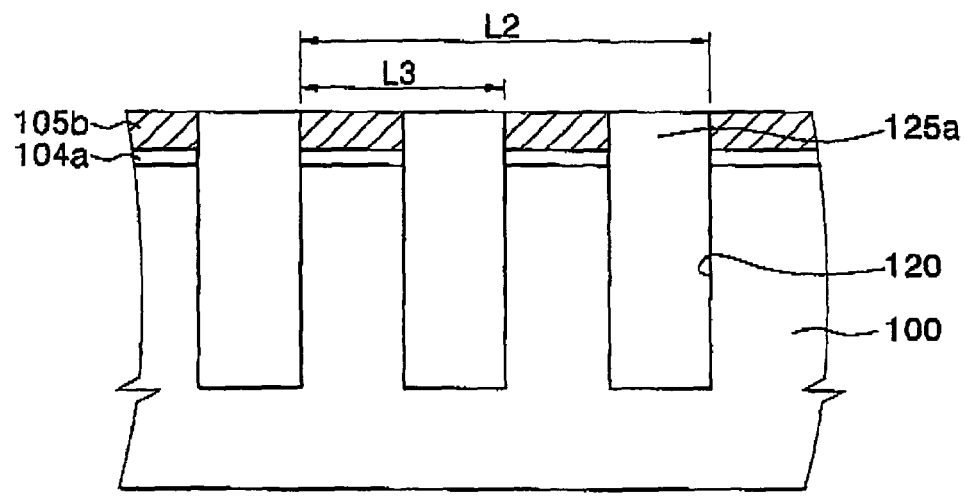

FIGS. 1A to 1E are cross-sectional views illustrating methods of forming fine patterns in accordance with some embodiments of the present invention, and FIGS. 1F to 1H are cross-sectional views illustrating methods of forming a trench isolation layer using methods of forming fine patterns in accordance with embodiments of the present invention. FIGS. 2A to 2G are cross-sectional views illustrating methods of forming a trench isolation layer in accordance with other embodiments of the present invention, FIGS. 3A to 3G are cross-sectional views illustrating methods of forming a trench isolation layer in accordance with still other embodiments of the present invention, FIGS. 4A to 4F are cross-sectional views illustrating methods of forming a trench isolation layer in accordance with yet other embodiments of the present invention, and FIGS. 5A and 5B are cross-sectional views illustrating methods of forming a trench isolation layer in accordance with yet other embodiments of the present invention.

First, methods of forming a fine pattern according to embodiments of the present invention will be described with reference to FIGS. 1A to 1E.

Referring to FIG. 1A, a substrate 100 is provided. The substrate 100 may be a semiconductor substrate. A buffer layer 104 may be formed on the substrate 100. An underlying layer 105 is formed on the substrate having the buffer layer 104. The buffer layer 104 may act to protect a surface of the substrate 100 when the underlying layer 105 is formed or patterned by a subsequent process. For example, the buffer layer 104 may be formed of a thermal oxide layer.

A hard mask layer is formed on the underlying layer 105. The hard mask layer may be formed of a material layer having an etch selectivity with respect to the underlying layer 105. For example, when the underlying layer 105 is formed of a conductive layer such as a polysilicon layer, the hard mask layer may be formed of a silicon nitride layer. Alternatively, when the underlying layer 105 is formed of a nitride layer such as a silicon nitride layer, the hard mask layer may be formed of silicon.

The hard mask layer is patterned to form a preliminary hard mask pattern 110 having a pitch L2 on the underlying layer 105. In this case, the preliminary hard mask pattern 110 may include a first pattern 110A having a width A2 that is spaced apart from a a second pattern 110B of the preliminary hard mask pattern 110 by a width B2 that is smaller than the width A2.

In order to form the preliminary hard mask pattern 110, a preliminary photoresist pattern 111 may be formed on the hard mask layer 112. The preliminary photoresist pattern 111 may have a pitch L1 as shown in FIG. 1A. The preliminary photoresist pattern 111 may include a first pattern 113A having a width A1 that is spaced apart from an adjacent pattern 113B of the preliminary photoresist pattern 111 by a distance B1 according to a resolution limit of photolithography equipment used to form the preliminary photoresist pattern 111. Subsequently, the width A1 of the first pattern 113A of the preliminary photoresist pattern 111 may be increased, making the distance between the first pattern 113A and the second pattern 113B of the preliminary photoresist pattern 111 narrow. The resulting photoresist pattern 111*a* has a first pattern 113A' having a width A2 larger than the width A1 of the corresponding first pattern 113A of the preliminary photoresist pattern 111. In this case, the first pattern 113A' of the photoresist pattern 111*a* may be spaced apart from an adjacent second pattern 113B' of the photoresist pattern 111*a* by a distance B2 that is smaller than the distance B1. In this case, a pitch of the photoresist pattern 111*a* is the distance L2, which may be substantially the same as the pitch L1.

The process of forming the photoresist pattern 111*a* may be performed, for example, by a photo flow technique. For example, when an annealing process is carried out after the preliminary photoresist pattern 111 is formed, the preliminary photoresist pattern 111 may be melted down to form the photoresist pattern 111*a*. The hard mask layer 112 may be etched using the photoresist pattern 111*a* as an etch mask to form the preliminary hard mask pattern 110 on the underlying layer 105. Subsequently, the photoresist pattern 111*a* may be removed.

Alternatively, a sacrificial mask having a width A1 may be formed on the hard mask layer, and a spacer covering a sidewall of the sacrificial mask may be formed. The sacrificial mask and the spacer may be formed of a material layer having an etch selectivity with respect to the hard mask layer. A mask including the sacrificial mask and the spacer may have the width A2 larger than the width A1. In addition, the mask may be spaced apart from an adjacent mask by a distance B2 smaller than the distance B1. The hard mask layer 112 may be etched using the mask as an etch mask to form the preliminary hard mask pattern 110 on the underlying layer 105. Subsequently, the sacrificial mask and the spacer may be removed.

Referring to FIG. 1B, the underlying layer (105 of FIG. 1A) is etched using the preliminary hard mask pattern 110 as an etch mask to form a preliminary underlying pattern 105*a*. Subsequently, the preliminary hard mask pattern 110 is pulled back to form a hard mask pattern 110*a* having a width A3 smaller than the width A2. Pulling back the preliminary hard mask pattern 110 may be accomplished, for example, by isotropically etching the preliminary hard mask pattern 110 to reduce the width of the features of the preliminary hard mask pattern 110. For example, when the preliminary hard mask pattern 110 is formed of a silicon nitride layer, the preliminary hard mask pattern 110 may be isotropically etched using a chemical solution containing phosphoric acid. As a result, edges of the preliminary hard mask pattern 110 may be reduced by a uniform distance A4 to form a hard mask pattern 110*a* having a width A3 at a center region of the preliminary underlying pattern 105*a*, as shown in FIG. 1B. Accordingly, portions of the hard mask pattern 110*a* may have the uniform width A3.

Before the photoresist pattern 111*a* is removed, the preliminary hard mask pattern 110 may be selectively etched to form the hard mask pattern 110*a* having edges regressed from edges of the preliminary hard mask pattern 110 by the uniform distance A4. After the formation of the hard mask pattern 110*a*, the photoresist pattern 111*a* may be removed.

Referring to FIG. 1C, an insulating layer 115 is formed on the substrate having the hard mask pattern 110*a*. The insulating layer 115 may be formed of a material layer having an etch selectivity with respect to the hard mask pattern 110*a* and the preliminary underlying pattern 105*a*. For example, when the hard mask pattern 110*a* is formed of a nitride layer and the preliminary underlying pattern 105*a* is formed of a silicon layer, the insulating layer 115 may be formed of a silicon oxide layer. Subsequently, the insulating layer 115 may be planarized to expose a top surface of the hard mask pattern 110*a*, thereby forming a planarized insulating layer 115. Planarizing the insulating layer may be performed, for example, by a chemical mechanical polishing (CMP) technique.

Referring to FIG. 1D, the hard mask pattern 110*a* is removed using the planarized insulating layer 115 as an etch mask to expose a predetermined region of the preliminary underlying pattern (105*a* of FIG. 1C). Subsequently, the exposed predetermined region of the preliminary underlying pattern (105*a* of FIG. 1C) is etched using the planarized insulating layer 115 as an etch mask to form an underlying pattern 105*b* having an opening 117 exposing the substrate 100 and the buffer layer 104. A portion of the underlying pattern 105*b* may have a width A4 smaller than the width A2. In addition, a portion of the underlying pattern 105*b* may be spaced apart from an adjacent portion of the underlying pattern 105*b* by the width A3. In this case, the width A3 may be substantially the same as the distance B2.

As a result, the underlying pattern 105*b* may have a pitch L3 smaller than the pitch L2 of the preliminary hard mask pattern (110 of FIG. 1A). Accordingly, the underlying pattern 105*b* has a pitch L3 smaller than the pitch L2 of the preliminary underlying pattern 105*a* formed by the preliminary hard mask pattern 110.

Further, the planarized insulating layer 115 may be selectively removed as shown in FIG. 1E. As a result, the underlying pattern 105*b* may be formed on the substrate 100.

The underlying pattern 105*b* may be formed of a conductive layer used for a gate electrode, a metal interconnection, or so forth. Alternatively, the underlying pattern 105*b* may be formed of a nitride layer such as a silicon nitride layer and may be used as a mask in a subsequent process.

A method of forming a trench isolation layer using the fine pattern formation method according to embodiments of the present invention will be described with reference to FIGS. 1F to 1H.

Referring to FIG. 1F, a substrate 100 is provided. Subsequently, a method similar to that described above with reference to FIGS. 1A to 1E is employed to form an underlying pattern 105*b* having a reduced pitch. The underlying pattern 105*b* may expose the field region 121 on the substrate 100 to serve as an etch mask in a trench isolation process. The process of forming the underlying pattern 105*b* having a reduced pitch on the substrate 100 has been described with reference to FIGS. 1A to 1E. The substrate 100 may be anisotropically etched using the underlying pattern 105*b* as an etch mask to form a trench 120 within the substrate 100.

A buffer insulating pattern 104*a* may be formed between the underlying pattern 105*b* and the substrate 100. The buffer insulating pattern 104*a* may be formed by the buffer layer 104 that is etched while the substrate 100 is etched using the underlying pattern 105*b* as an etch mask. The buffer insulating pattern 104*a* may be formed of a silicon oxide layer such as a thermal oxide layer.

Referring to FIG. 1 G, a preliminary trench isolation layer 125 is formed on the substrate having the trench 120. The preliminary trench isolation layer 125 may be formed of a material layer having an etch selectivity with respect to the underlying pattern 105*b*. For example, when the underlying pattern 105*b* is formed of a silicon nitride layer, the preliminary trench isolation layer 125 may be formed of a silicon oxide layer.

In the meantime, although not shown in the same Figure, prior to the formation of the preliminary trench isolation layer 125, the substrate having the trench 120 may be thermally oxidized to form a thermal oxide layer on inner walls of the trench 120. The thermal oxide layer may serve to reduce etch damage caused to the substrate 100 during the anisotropic etching process for forming the trench 120. In addition, after the formation of the thermal oxide layer, an optional insulating liner may be formed.

Referring to FIG. 1H, the preliminary trench isolation layer 125 is planarized to expose a top surface of the underlying pattern 105b, so that a trench isolation layer 125a is formed to fill the trench 120. The planarization of the preliminary trench isolation layer 125 may be performed, for example, by a CMP technique.

The trench isolation layer 125a may have a top surface disposed on substantially the same line as the top surface of the underlying pattern 105b and/or a portion of the underlying pattern 105b may be removed. In addition, the trench isolation layer 125a may be formed within the substrate of the field region to define the active region. Subsequently, the underlying pattern 105b may be removed. In addition, if the buffer insulating pattern 104a is provided, the buffer insulating pattern 104a may be removed when the underlying pattern 105b is removed.

Consequently, the active region defined by the trench isolation layer 125a may have a width smaller than the width which may be obtained using conventional techniques, due to the resolution limit of the photolithography equipment. In addition, according to some embodiments of the present invention, the underlying pattern 105b may have a uniform width as described with reference to FIG. 1B, so that the active region defined in the substrate below the underlying pattern 105b may have a uniform area.

Methods of forming a trench isolation layer according to other embodiments of the present invention will be described with reference to FIGS. 2A to 2G.

Figure 2A:
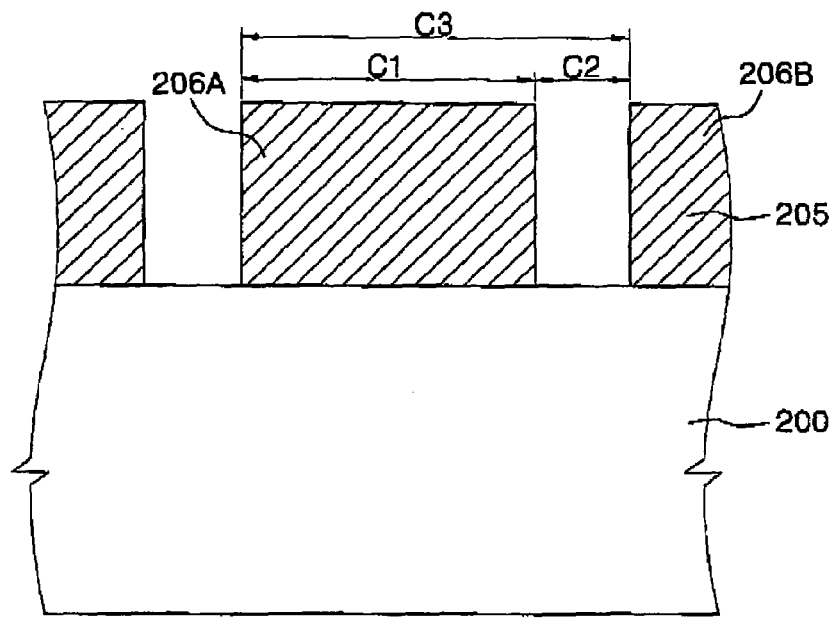
FIGS. 2A to 2G are cross-sectional views illustrating methods of forming a trench isolation layer in accordance with some other embodiments of the present invention.

Referring to FIG. 2A, a substrate 200 is provided. A first portion 206A of a preliminary hard mask pattern 205 having a width C1 is formed on the substrate 200. In this case, the first portion 206A of the preliminary hard mask pattern 205 may be spaced apart from an adjacent portion 206B of the preliminary hard mask pattern 205 by a distance C2. In this case, the width C1 may be greater than the distance C2. That is, the preliminary hard mask pattern 205 may be formed by a process which may result in a pitch of a distance C3.

As such, the formation method of the preliminary hard mask pattern 205 having the width C1 greater than the distance C2 maybe similar to the method of forming the preliminary hard mask pattern (110 of FIG. 1A) described with reference to FIG. 1A.

In the meantime, although not shown in the same Figure, prior to the formation of the preliminary hard mask pattern 205, a buffer insulating layer for protecting a surface of the substrate 200 may be formed. The buffer insulating layer may be formed of a thermal oxide layer.

Figure 2B:
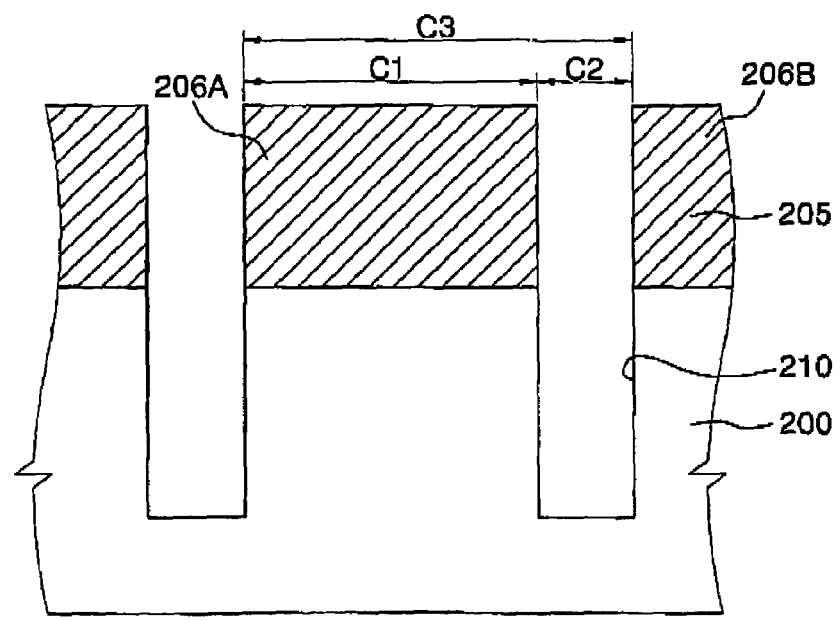

Referring to FIG. 2B, the substrate 200 is anisotropically etched using the preliminary hard mask pattern 205 as an etch mask to form a first trench 210 within the substrate 200.

In the meantime, although not shown in the same Figure, after the formation of the first trench 210, the substrate having the first trench 210 may be thermally oxidized to form a thermal oxide layer on inner walls of the first trench 210. The thermal oxide layer may serve to reduce etch damage caused to the substrate 200 during the anisotropic etching process for forming the trench 210. In addition, the thermal oxide layer may serve to protect the substrate exposed by the first trench 210 while the preliminary hard mask pattern 205 is pulled back, which will be described later.

Figure 2C:
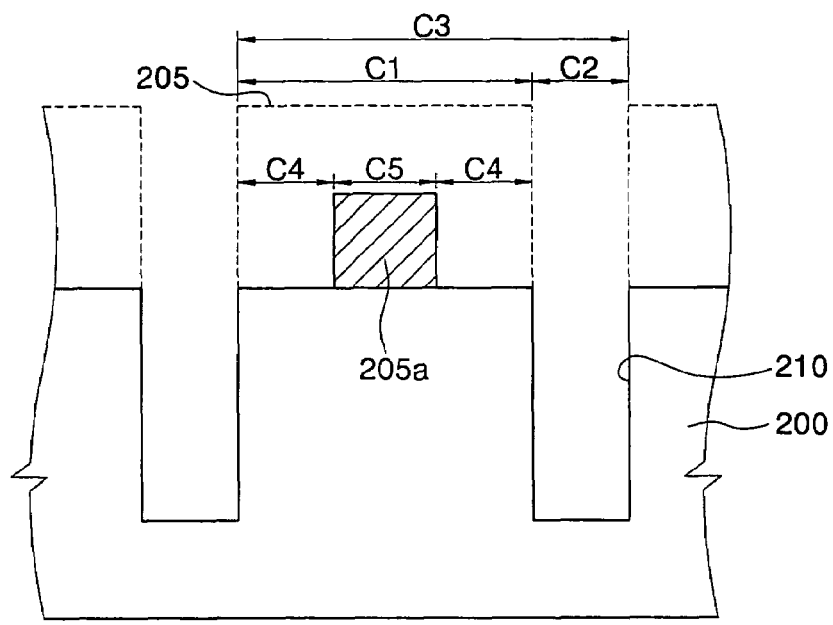

Referring to FIG. 2C, the preliminary hard mask pattern 205 is pulled back to form a hard mask pattern 205a having a width C5 smaller than the width C1. Pulling back the preliminary hard mask pattern 205 may be accomplished, for example, by isotropically and selectively etching the preliminary hard mask pattern 205 to reduce a width of the preliminary hard mask pattern 205. For example, when the preliminary hard mask pattern 205 is formed of silicon nitride, the preliminary hard mask pattern 205 may be isotropically etched using a chemical solution containing phosphoric acid. As a result, the hard mask pattern 205a may have a width reduced by a uniform distance C4 from edges of the preliminary hard mask pattern 205. Accordingly, the hard mask pattern 205a and adjacent patterns of the hard mask pattern which are formed on the substrate 200 may have a uniform width C5.

Figure 2D:
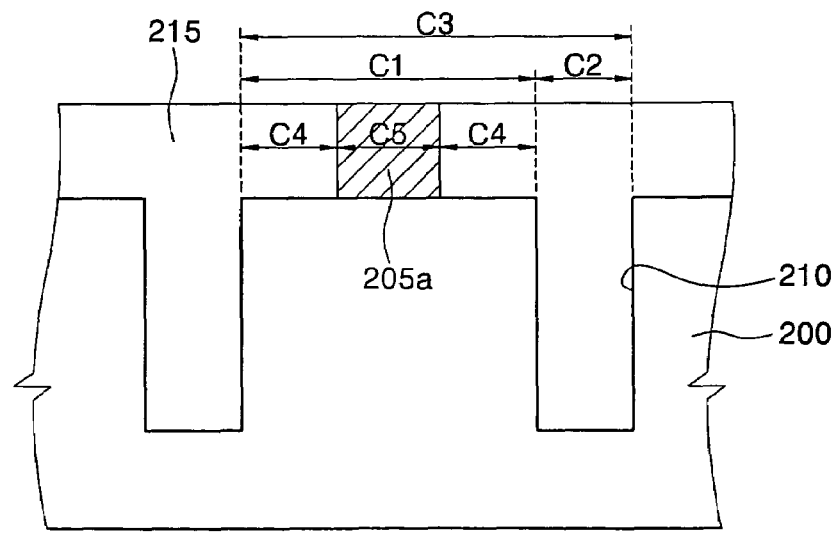

Referring to FIG. 2D, an insulating layer is formed on the substrate having the hard mask pattern 205a. The insulating layer may be formed of a material layer having an etch selectivity with respect to the hard mask pattern 205a and the substrate 200. For example, when the hard mask pattern 205a is formed of silicon nitride and the substrate 200 is formed of silicon, the insulating layer may be formed of silicon oxide. Subsequently, the insulating layer may be planarized to expose a top surface of the hard mask pattern 205a, so that a first preliminary trench isolation layer 215 is formed. The planarization of the insulating layer may be performed, for example, by a CMP technique.

Figure 2E:
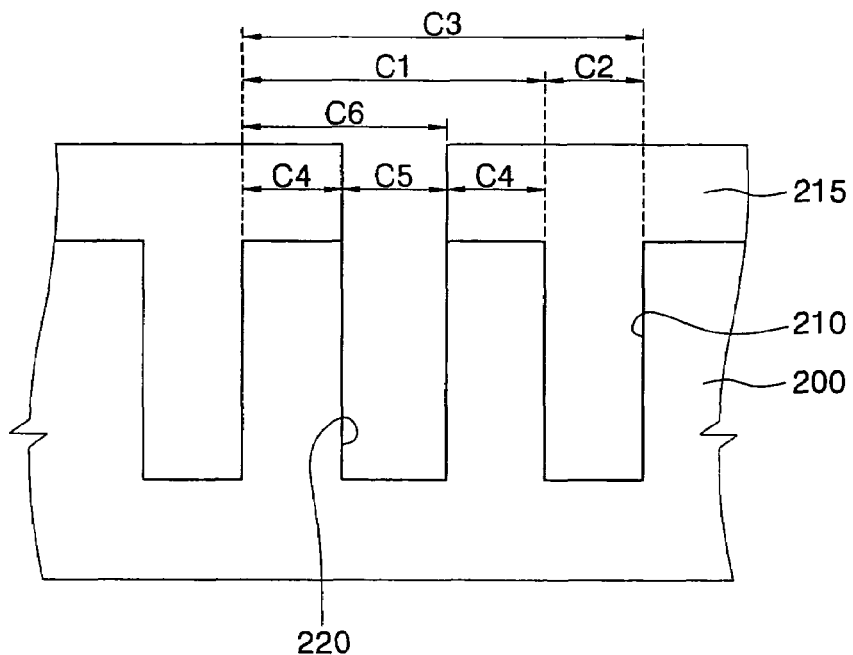

Referring to FIG. 2E, the hard mask pattern 205a may be removed by etching using the first preliminary trench isolation layer 215 as an etch mask to expose a predetermined region of the substrate 200. Subsequently, the substrate 200 exposed using the first preliminary trench isolation layer 215 as an etch mask is anisotropically etched to form a second trench 220 within the substrate 200. The first and second trenches 210 and 220 may be formed in the field region of the substrate 200.

The second trench 220 may have a width C5. In addition, the first trench 210 may have a width C2. In some embodiments, the widths C5 and C2 may be substantially the same. An active region having a width C4 may be disposed between the first trench 210 and the second trench 220. The width C4 is uniform as described with reference to FIG. 2C, so that the active region and an adjacent active region may have a uniform area. The first and second trenches 210 and 220 and the active region may have a pitch of a distance C6 as shown in FIG. 2E.

Although not shown in the same Figure, after the formation of the second trench 220, the substrate having the second trench 220 may be thermally oxidized to form a thermal oxide layer on inner walls of the second trench 220. The thermal oxide layer may serve to reduce etch damage applied to the substrate 200 during the anisotropic etching process for forming the second trench 220.

Figure 2F:
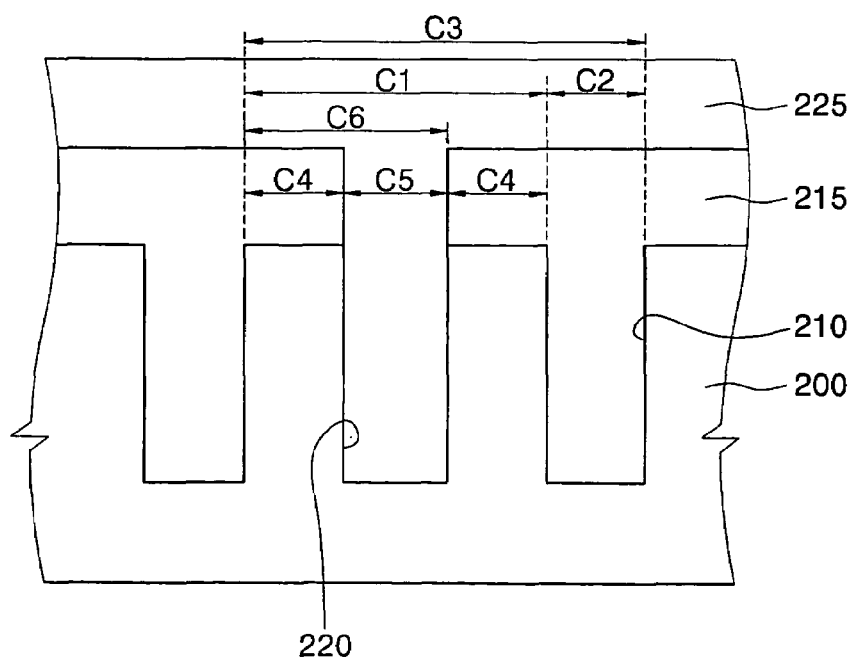

Subsequently, as shown in FIG. 2F, a second preliminary trench isolation layer 225 is formed on the substrate having the second trench 220. The second preliminary trench isolation layer 225 may be formed, for example, of silicon oxide.

Figure 2G:
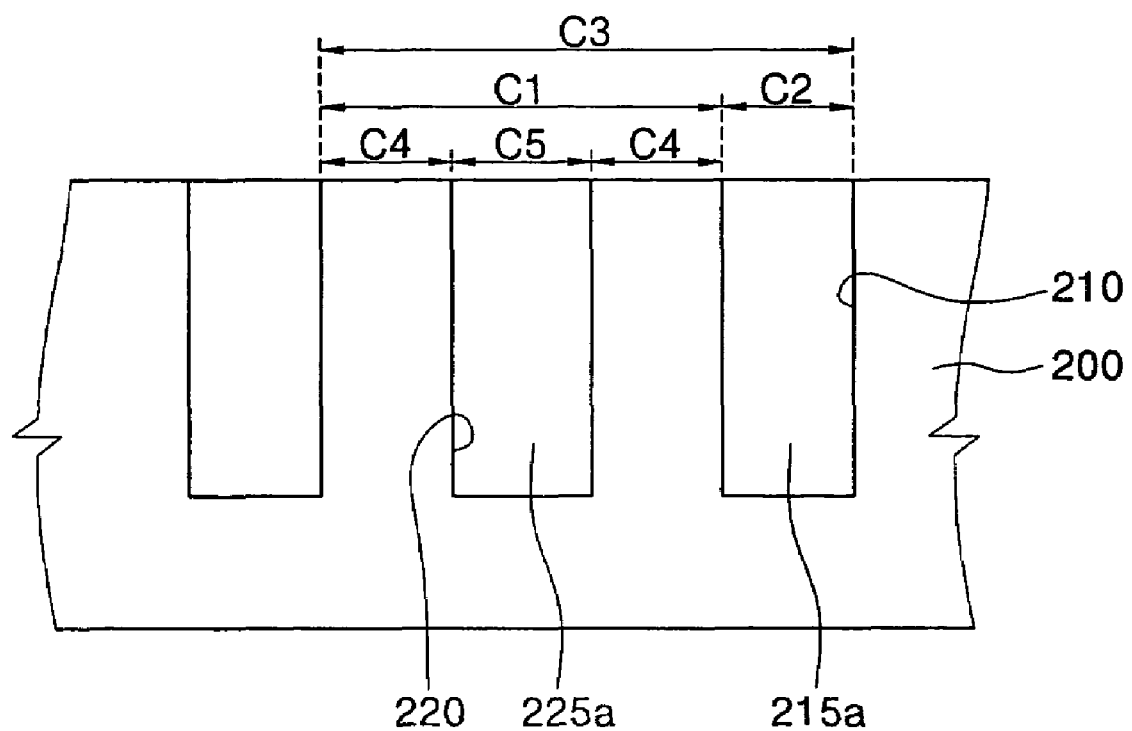

Referring to FIG. 2G, a CMP technique may be employed to planarize a top surface of the second preliminary trench isolation layer 225. Subsequently, the first and second preliminary trench isolation layers 215 and 225 are planarized until the top surface of the substrate 200 is exposed, so that first and second trench isolation layers 215a and 225a are formed within the first and second trenches 210 and 220, respectively. The planarization of the first and second preliminary trench isolation layers 215 and 225 may be performed, for example, by an etch back technique.

Consequently, the active region(s) defined by the first and second trench isolation layers 215a and 225a may have a width smaller than the width which may be obtained using conventional photolithography techniques. In addition, the active regions defined by the first and second trench isolation layers 215a and 225a may have a uniform area.

Methods of forming a trench isolation layer according to still other embodiments of the present invention will be described with reference to FIGS. 3A to 3F.

Figure 3A:
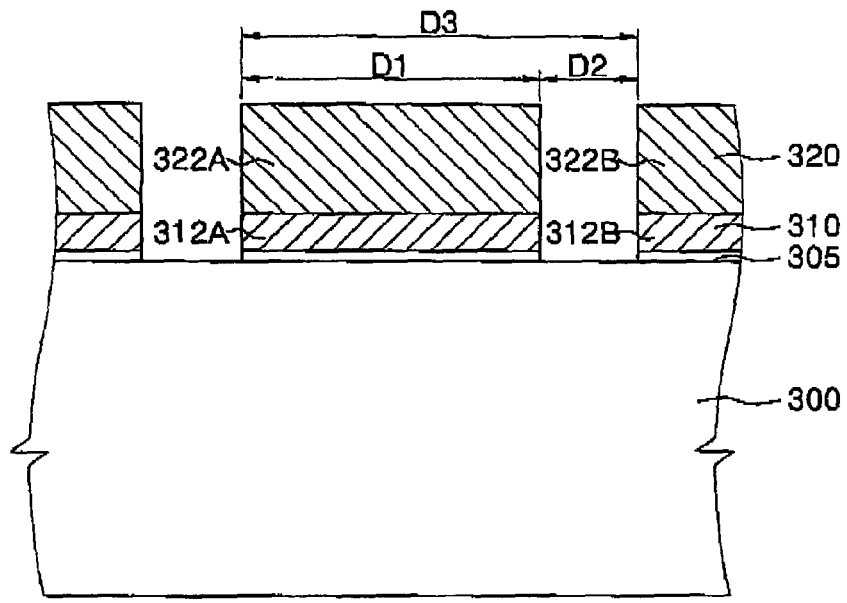
FIGS. 3A to 3G are cross-sectional views illustrating methods of forming a trench isolation layer in accordance with still other embodiments of the present invention.

Referring to FIG. 3A, a substrate 300 is provided. The substrate 300 may be formed, for example, of silicon. A lower preliminary hard mask layer and an upper preliminary hard mask layer are sequentially stacked on the substrate 300. The upper preliminary hard mask layer may be formed of a material layer having an etch selectivity with respect to the lower preliminary hard mask layer. In addition, the upper preliminary hard mask layer may be formed of a material having an etch selectivity with respect to the substrate 300. For example, the upper preliminary hard mask layer may be formed of silicon nitride.

Prior to the formation of the lower preliminary hard mask layer, a buffer insulating layer may be formed on the substrate 300. The buffer insulating layer may be, for example, a thermal oxide layer.

The lower and upper preliminary hard mask layers may be patterned to form lower and upper preliminary hard mask patterns 310 and 320 having a width D1, respectively. When the lower and upper preliminary hard mask layers 310, 320 are patterned, the buffer insulating layer may also be patterned to form a preliminary buffer insulating pattern 305.

First patterns 312A and 322A of the the lower and upper preliminary hard mask patterns 310 and 320, which are sequentially stacked on the substrate 300, may be spaced apart from adjacent lower and upper preliminary hard mask patterns 312B, 322B by a distance D2. In this case, each of the first patterns 312A, 322A of the lower and upper preliminary hard mask patterns 310 and 320 may have a width D1 that is greater than the distance D2. That is, the lower and upper preliminary hard mask patterns 310 and 320 may be formed by a process which may implement a pitch of a distance D3.

As such, the lower and upper preliminary hard mask patterns 310 and 320 may be formed using methods similar to the methods of forming the preliminary hard mask pattern (110 of FIG. 1A) described above with reference to FIG. 1A.

Figure 3B:
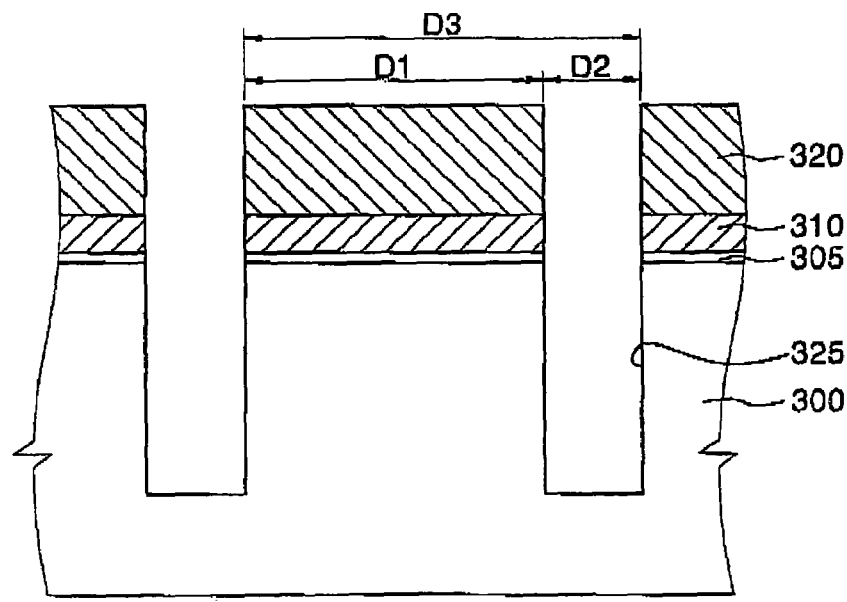

Referring to FIG. 3B, the substrate 300 may be anisotropically etched using the upper preliminary hard mask pattern 320 as an etch mask to form a first trench 325 within the substrate 300.

In the meantime, although not shown in the same Figure, after the formation of the first trench 325, the substrate 300 having the first trench 325 may be thermally oxidized to form a thermal oxide layer on inner walls of the first trench 325. The thermal oxide layer may serve to reduce etch damage caused to the substrate 300 during the anisotropic etching process for forming the trench 325. In addition, the thermal oxide layer may serve to protect the portions of the substrate 300 exposed by the first trench 325 when the upper preliminary hard mask pattern 320 is pulled back, as described below.

Figure 3C:
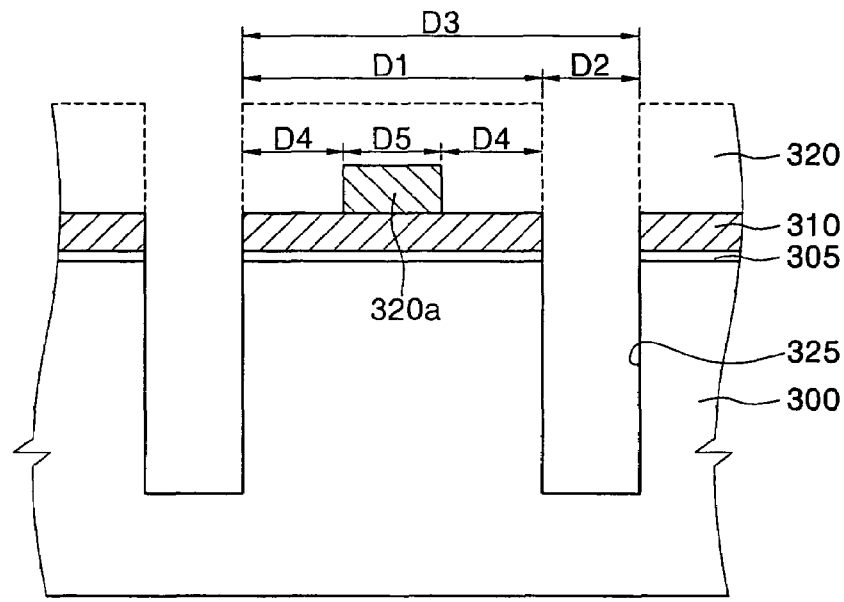

Referring to FIG. 3C, the upper preliminary hard mask pattern 320 is pulled back to form an upper hard mask pattern 320a having a width D5 smaller than the width D1. Pulling back the upper preliminary hard mask pattern 320 may be accomplished, for example, using a process of isotropically and selectively etching the upper preliminary hard mask pattern 320 to reduce the width of the upper preliminary hard mask pattern 320. As a result, the upper hard mask pattern 320a may have a width reduced by the uniform distance D4 from edges of the upper preliminary hard mask pattern 320.

Figure 3D:
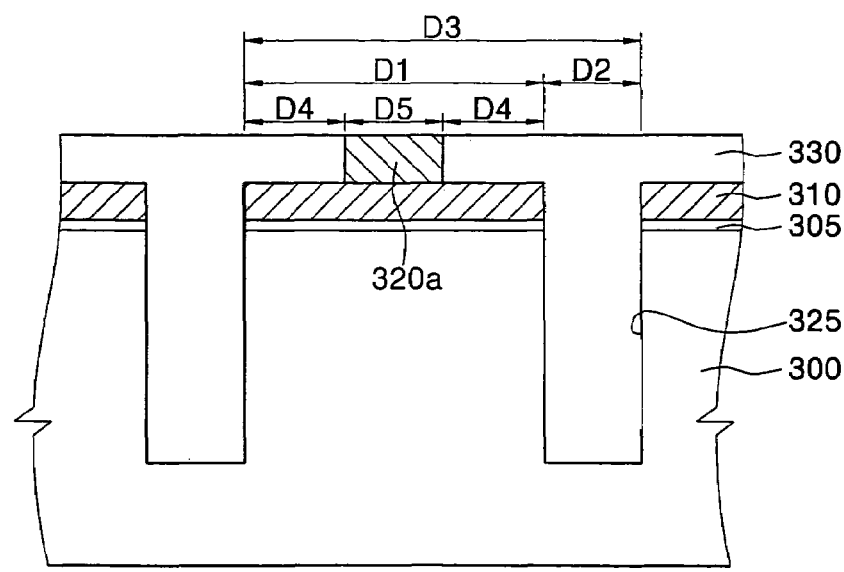

Referring to FIG. 3D, an insulating layer is formed on the substrate having the upper hard mask pattern 320a. The insulating layer may be formed of a material layer having an etch selectivity with respect to the upper hard mask pattern 320a, the lower preliminary hard mask pattern 310, and the substrate 300. For example, when the upper hard mask pattern 320a is a silicon nitride layer, the lower preliminary hard mask pattern 310 is a polysilicon layer, and the substrate 300 is a silicon layer, the insulating layer may include a silicon oxide layer. Subsequently, the insulating layer may be planarized to expose a top surface of the upper hard mask pattern 320a, so that a first preliminary trench isolation layer 330 is formed. The planarization of the insulating layer may be performed, for example, by a CMP technique.

Figure 3E:
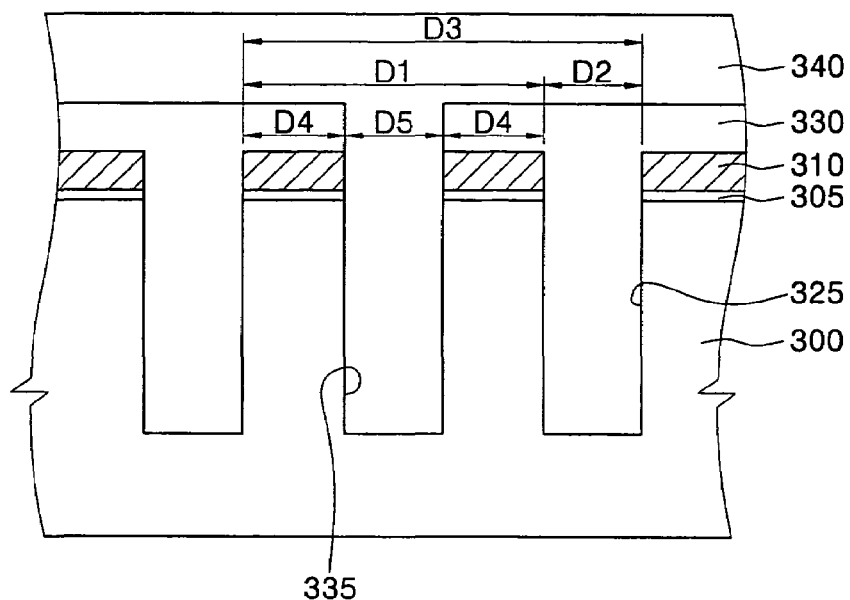

Referring to FIG. 3E, the upper hard mask pattern 320a may be removed by etching using the first preliminary trench isolation layer 330 as an etch mask. As a result, a predetermined region of the lower preliminary hard mask pattern 310 may be exposed. The exposed lower preliminary hard mask pattern 310, and the preliminary buffer insulating pattern 305 below the lower preliminary hard mask pattern 310 may be sequentially etched using the first preliminary trench isolation layer 330 as an etch mask, so that a buffer insulating pattern 305a and a lower hard mask pattern 310a having an opening for exposing a predetermined region of the substrate 300 may be formed.

Subsequently, the exposed substrate 300 may be anisotropically etched using the first preliminary trench isolation layer 330 as an etch mask to form a second trench 335. The first and second trenches 325 and 335 may be formed in the field region of the substrate 300.

Although not shown in the same Figure, after the formation of the second trench 335, the substrate 300 having the second trench 335 may be thermally oxidized to form a thermal oxide layer on inner walls of the second trench 335. The thermal oxide layer may serve to reduce etch damage caused to the substrate 300 during the anisotropic etching process for forming the second trench 335.

A second preliminary trench isolation layer 340 is formed on the substrate having the second trench 335. The second preliminary trench isolation layer 340 may be a silicon oxide layer.

Figure 3F:
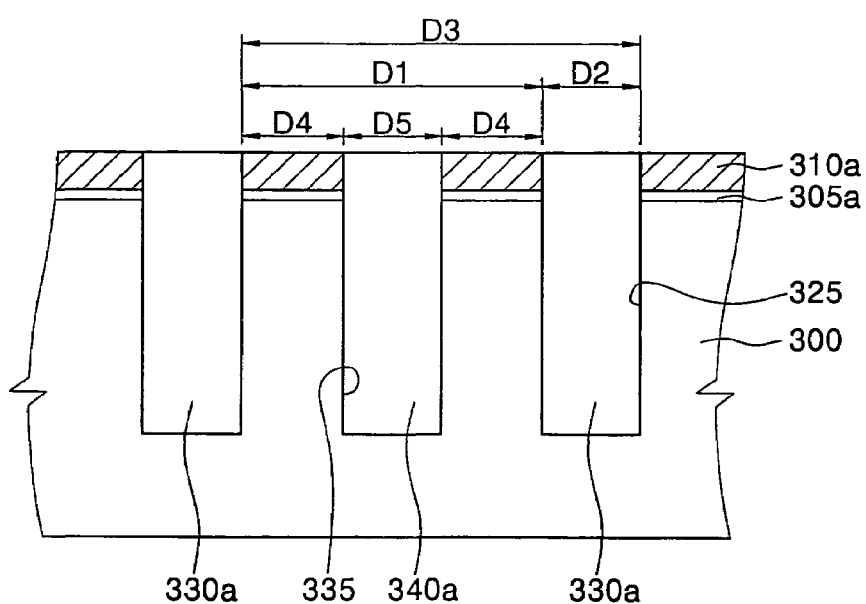
Figure 3G:
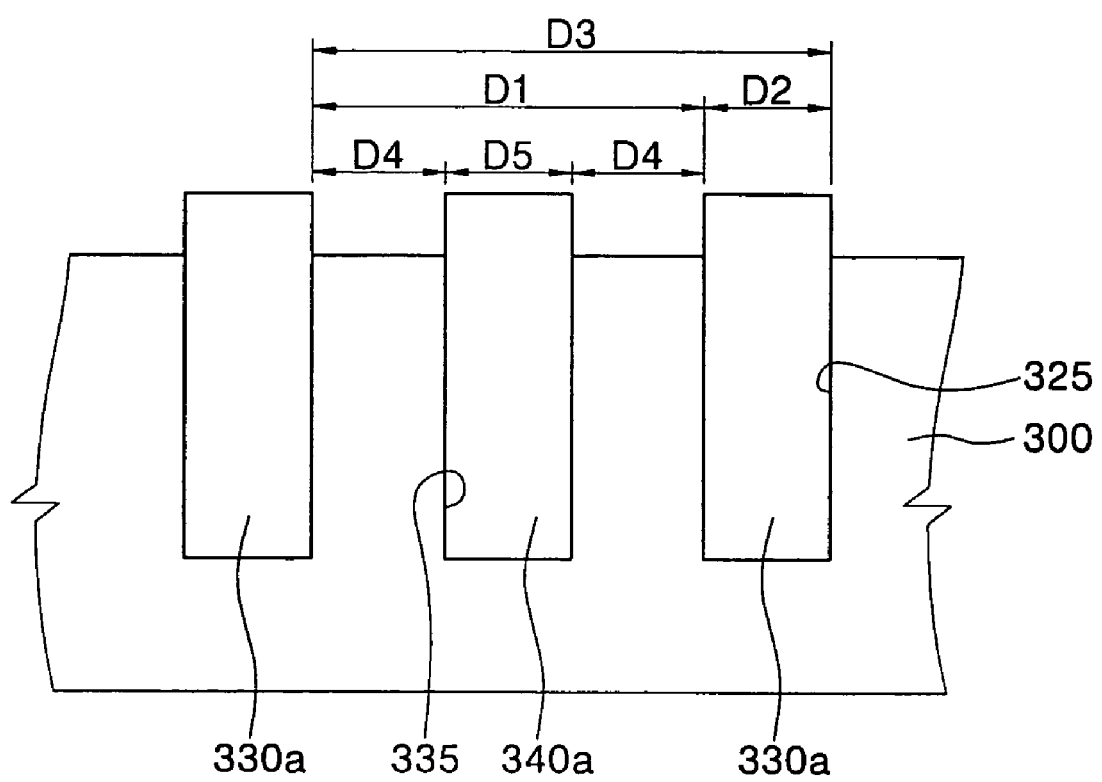

Referring to FIG. 3F, the first and second preliminary trench isolation layers 330 and 340 may be planarized until the top surface of the lower hard mask pattern 310a is exposed, so that first and second trench isolation layers 330a and 340a are formed to fill the first and second trenches 325 and 335, respectively. The planarization of the first and second preliminary trench isolation layers 330 and 340 may be performed, for example, by a CMP technique.

After planarization, the first and second trench isolation layers 330a and 340a may have top surfaces disposed on substantially the same plane as the top surface of the lower hard mask pattern 310a. In addition, the first and second trench isolation layers 330a and 340a may be formed within the substrate of the field region to define the active region. Subsequently, the lower hard mask pattern 310a may be removed. That is, the lower hard mask pattern 310a may be etched using the first and second trench isolation layers 330a and 340a as etch masks. Accordingly, the first and second trench isolation layers 330a and 340a may have top surfaces higher than the top surface of the substrate 300 that is exposed after etching the hard mask pattern 310a.

The first trench isolation layer 330a may have a width D2, and the second trench isolation layer 340a may have a width D5. In this case, the width D2 may be substantially equal to the width D5. In addition, the active regions defined by the first and second trench isolation layers 330a and 340a may have a width D4.

As described above, the active region defined by the first and second trench isolation layers 330a and 340a may have a width smaller than a width which may be obtained using conventional photolithography techniques. In addition, the active regions defined by the first and second trench isolation layers 330a and 340a may have a uniform area.

Methods of forming a trench isolation layer according to yet other embodiments of the present invention will be described with reference to FIGS. 4A to 4F.

Figure 4A:
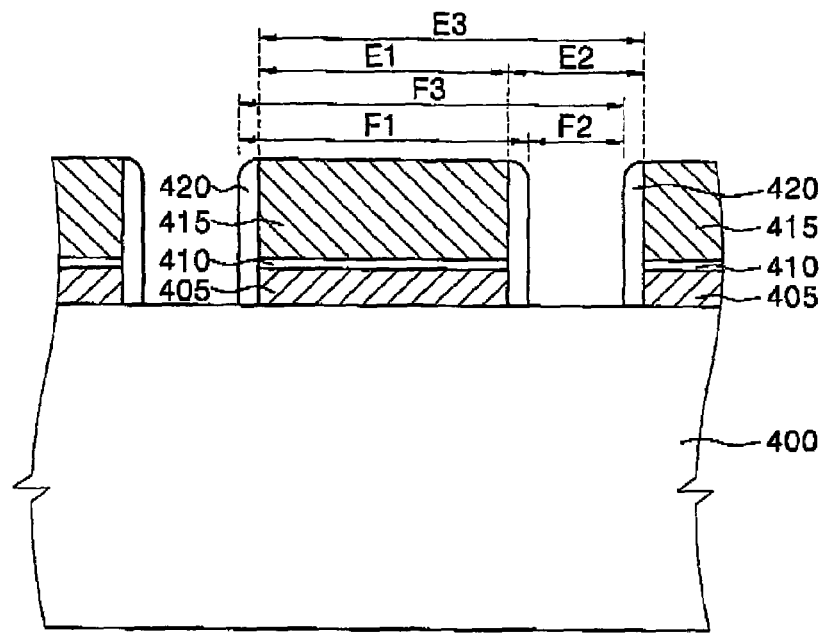
FIGS. 4A to 4F are cross-sectional views illustrating methods of forming a trench isolation layer in accordance with yet other embodiments of the present invention.
Figure 5A:
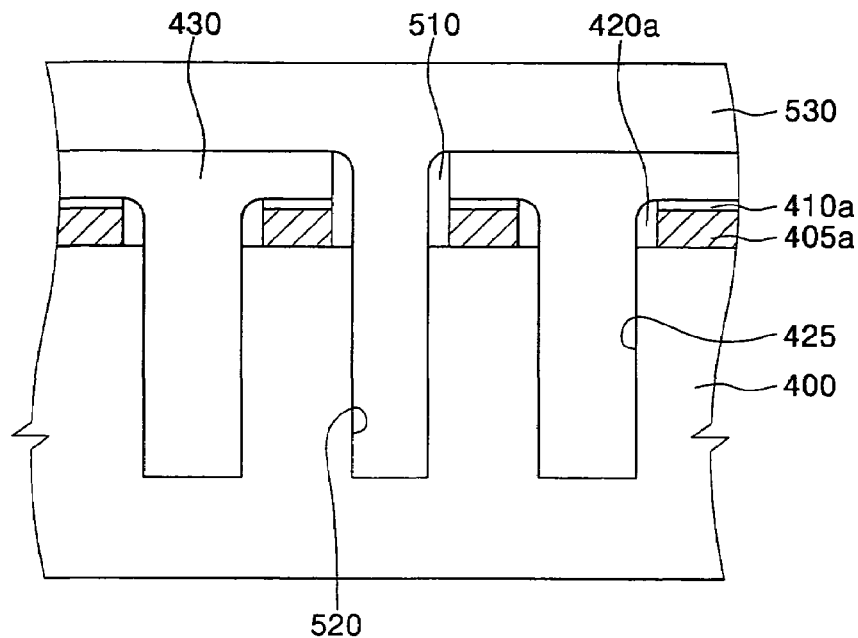
FIGS. 5A and 5B are cross-sectional views illustrating methods of forming a trench isolation layer in accordance with yet other embodiments of the present invention.
Figure 5B:
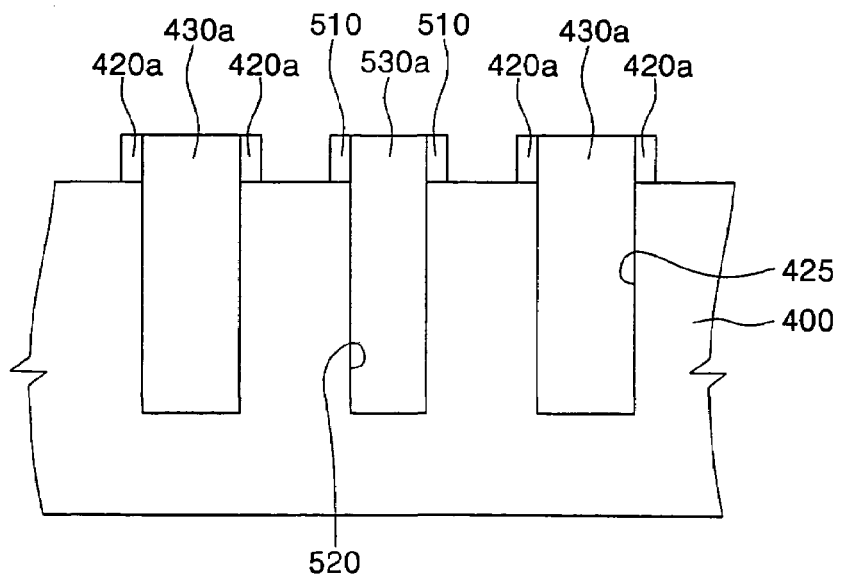

Referring to FIG. 4A, a substrate 400 is provided. The substrate 400 may be a silicon substrate. A lower preliminary hard mask layer, a buffer insulating layer, and an upper preliminary hard mask layer are sequentially stacked on the substrate 400. The upper preliminary hard mask layer may be formed of a material having an etch selectivity with respect to the buffer insulating layer. For example, when the buffer insulating layer is formed of an oxide layer, the upper preliminary hard mask layer may be formed of a nitride layer. In addition, the lower preliminary hard mask layer may be formed of the same material as the upper preliminary hard mask layer, e.g. a nitride layer. Alternatively, the lower preliminary hard mask layer may be formed of a material different from the upper preliminary hard mask layer, e.g. a material having a different etch selectivity.

The upper preliminary hard mask layer, the buffer insulating layer, and the lower preliminary hard mask layer are sequentially patterned to form a lower preliminary hard mask pattern 405, a preliminary buffer insulating pattern 410, and an upper preliminary hard mask pattern 415, which have a width E1 and are sequentially stacked on the substrate 400. In the meantime, an adjacent upper preliminary hard mask pattern may be spaced apart from the upper preliminary hard mask pattern 415 by a distance E2. The lower preliminary hard mask pattern 405, the preliminary buffer insulating pattern 410, and the upper preliminary hard mask pattern 415 may be formed by a process which may provide a pitch of a distance E3. In this case, the lower preliminary hard mask pattern 405, the preliminary buffer insulating pattern 410, and the upper preliminary hard mask pattern 415, which have the width E1 greater than the distance E2, are sequentially stacked on the substrate 400.

As such, the formation of the lower preliminary hard mask pattern 405, the preliminary buffer insulating pattern 410, and the upper preliminary hard mask pattern 415 each having the width E1 greater than the distance E2 may employ the methods of forming the photoresist pattern (111a of FIG. 1A) described with reference to FIG. 1A.

As such, the method of forming the lower preliminary hard mask pattern 405, the preliminary buffer insulating pattern 410, and the upper preliminary hard mask pattern 415 each having the width E1 greater than the distance E2 may be similar to the method of forming the preliminary hard mask pattern (110 of FIG. 1A) described with reference to FIG. 1A.

A first preliminary insulating spacer 420 is formed to cover sidewalls of the lower preliminary hard mask pattern 405, the preliminary buffer insulating pattern 410, and the upper preliminary hard mask pattern 415 which are sequentially stacked on the substrate 400. The first preliminary insulating spacer 420 may be formed of a material having an etch selectivity with respect to at least the upper preliminary hard mask pattern 415. As a result, the material layers 405, 410, 415, and 420 covering the substrate 400 by the thickness of the first preliminary insulating spacer 420 may have a width F1 greater than the width E1. In addition, the material layers 405, 410, 415, and 420 covering the substrate 400 may be spaced apart from other adjacent material layers by a distance F2, which is smaller than the distance E2. As a result, the materials 405, 410, 415, and 420 may have a pitch of a distance F3. In this case, the distance F3 may be substantially equal to the distance E3.

Figure 4B:
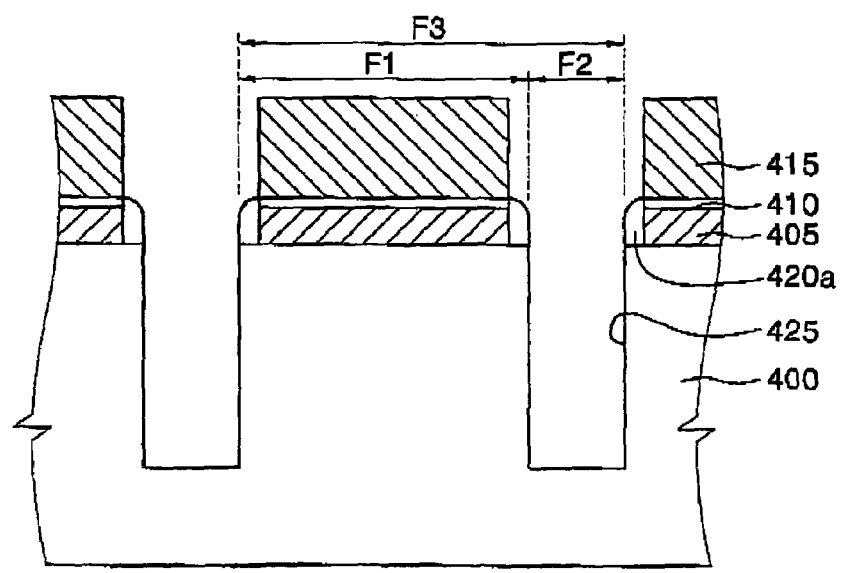

Referring to FIG. 4B, the substrate 400 may be anisotropically etched using the upper preliminary hard mask pattern 415 and the first preliminary insulating spacer 420 as etch masks to form a first trench 425 within the substrate 400. Accordingly, an upper width of the first trench 425 may have the distance F2.

While the substrate 400 is anistropically etched, the first preliminary insulating spacer 420 may be etched to expose at least the sidewall of the upper preliminary hard mask pattern 415. As a result, a first insulating spacer 420a may be formed.

In the meantime, when the lower preliminary hard mask pattern 405 is formed of a material having substantially the same etch selectivity as the upper preliminary hard mask pattern 415, the first insulating spacer 420a may expose the sidewall of the upper preliminary hard mask pattern 415 and simultaneously cover at least the sidewall of the lower preliminary hard mask pattern 405. Although not shown in the same Figure, after the formation of the first trench 425, the substrate having the first trench 425 may be thermally oxidized to form a thermal oxide layer on inner walls of the first trench 425.

Figure 4C:
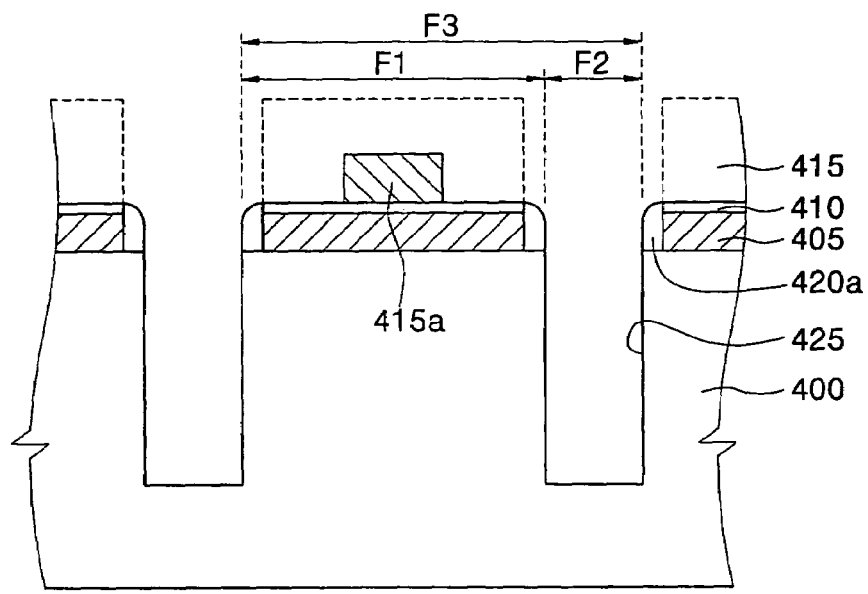

Referring to FIG. 4C, the upper preliminary hard mask pattern 415 is pulled back to form an upper hard mask pattern 415a having a width smaller than the width E1 of the upper preliminary hard mask pattern 415. Pulling back the upper preliminary hard mask pattern 415 may be accomplished, for example, using a process of isotropically and selectively etching the upper preliminary hard mask pattern 415 to reduce a width of the upper preliminary hard mask pattern 415. As a result, the upper hard mask pattern 415a may have a width reduced by a uniform distance from edges of the upper preliminary hard mask pattern 415.

Figure 4D:
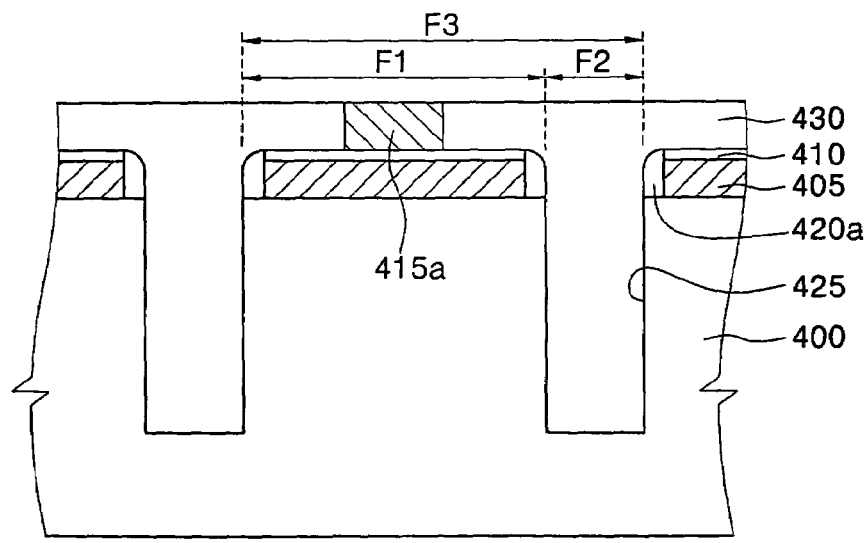

Referring to FIG. 4D, an insulating layer is formed on the substrate having the upper hard mask pattern 415a. The insulating layer may be formed of a material having an etch selectivity with respect to the upper hard mask pattern 415a, the lower preliminary hard mask pattern 405, and the substrate 400. For example, when the upper hard mask pattern 415a and the lower preliminary hard mask pattern 405 are formed of silicon nitride and the substrate 400 is formed of silicon, the insulating layer may be formed of silicon oxide. In addition, when the upper hard mask pattern 415a is formed of silicon nitride, the lower preliminary hard mask pattern 405 is formed of polysilicon, and the substrate 400 is formed of silicon, the insulating layer may be formed of silicon oxide.

Subsequently, the insulating layer is planarized until a top surface of the upper hard mask pattern 415a is exposed, so that a first preliminary trench isolation layer 430 is formed. The planarization of the insulating layer may be performed, for example, by a CMP technique.

Figure 4E:
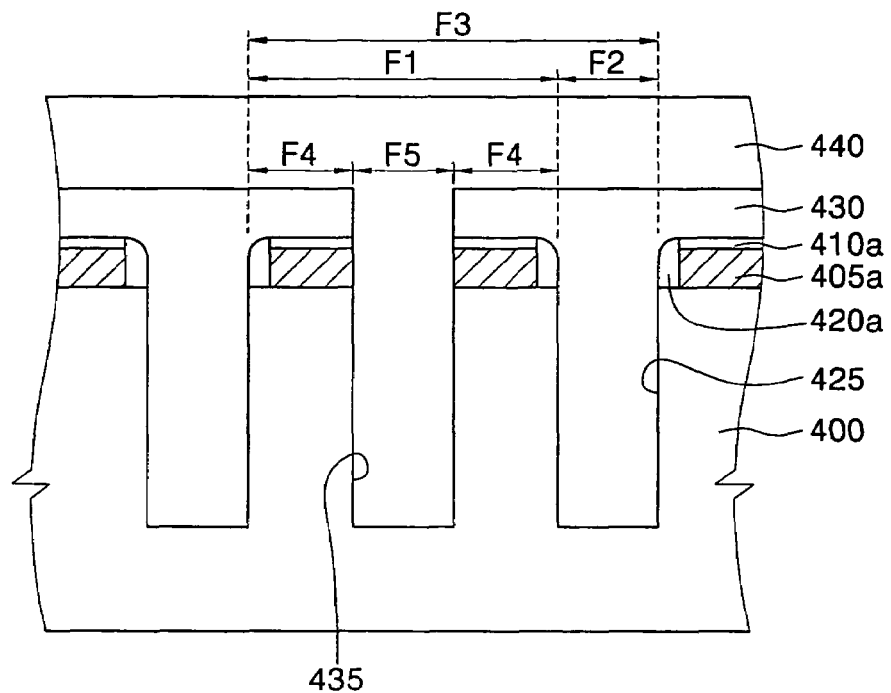

Referring to FIG. 4E, the upper hard mask pattern 415a may be removed by etching using the first preliminary trench isolation layer 430 as an etch mask. As a result, a portion of the preliminary buffer insulating pattern 410 may be exposed. The exposed preliminary buffer insulating pattern 410 and the lower preliminary hard mask pattern 405 below the exposed preliminary buffer insulating pattern 410 may be sequentially etched using the first preliminary trench isolation layer 430 as an etch mask, so that a buffer insulating pattern 410a and a lower hard mask pattern 405a having an opening for exposing the predetermined region of the substrate 400 may be formed.

Subsequently, the exposed substrate 400 may be anisotropically etched using the first preliminary trench isolation layer 430 as an etch mask to form a second trench 435. The first and second trenches 425 and 435 may be formed in the field region of the substrate 400. An upper region of the second trench 435 may have a width F5. In addition, the active region disposed between the first and second trenches 425 and 435 may have a width F4.

Although not shown in the same Figure, after the formation of the second trench 435, the substrate having the second trench 435 may be thermally oxidized to form a thermal oxide layer on inner walls of the second trench 435. The thermal oxide layer may serve to reduce etch damage caused to the substrate 400 during the anisotropic etching process for forming the second trench 435.

A second preliminary trench isolation layer 440 may be formed on the substrate having the second trench 435. The second preliminary trench isolation layer 440 may be formed of silicon oxide.

Figure 4F:
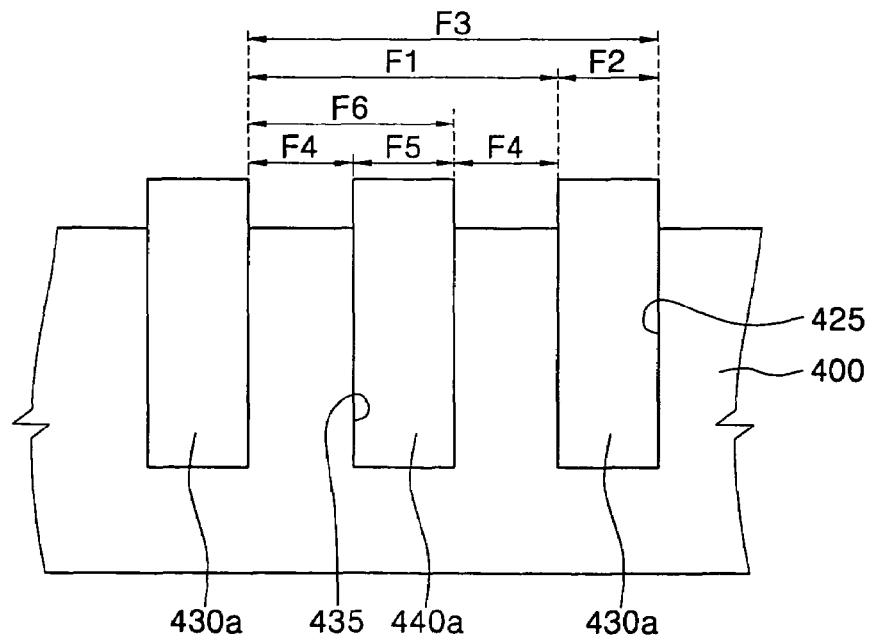

Referring to FIG. 4F, the first and second preliminary trench isolation layers 430 and 440 may be planarized to expose the top surface of the lower hard mask pattern 405a, so that first and second trench isolation layers 430a and 440a are formed to fill the first and second trenches 425 and 435, respectively. The planarization of the first and second preliminary trench isolation layers 430 and 440 may be performed, for example, by a CMP technique. The buffer insulating pattern 410a may be removed while the first and second preliminary trench isolation layers 430 and 440 are planarized.

The first and second trench isolation layers 430a and 440a may have top surfaces disposed on substantially the same line as the top surface of the lower hard mask pattern 405a. In addition, the first and second trench isolation layers 430a and 440a may be formed within the substrate of the field region to define the active region. Subsequently, the lower hard mask pattern 405a may be removed. Accordingly, the first and second trench isolation layers 430a and 440a may have top surfaces higher than the top surface of the substrate 400.

The first trench isolation layer 430a may have a width F2, and the second trench isolation layer 440a may have a width F5. In this case, the width F2 may be substantially equal to the width F5. In addition, the active region defined by the first and second trench isolation layers 430a and 440a may have a width F4. As such, the active region defined by the first and second trench isolation layers 430a and 440a may be formed by processes according to the present invention which may implement a pitch of a distance F6 smaller than the distance F3.

Accordingly, the first and second trench isolation layers 430a and 440a and the active regions defined thereby may have the pitch of the distance F6 smaller than the pitch of the distance F3 which may be obtained using conventional photoresist patterning techniques. In addition, the active regions may have a uniform area.

Methods of forming a trench isolation layer according to yet other embodiments of the present invention will be described with reference to FIGS. 5A and 5B.

Referring to FIG. 5A, a substrate 400 is provided. Subsequently, a first preliminary trench isolation layer 430 may be formed using methods similar to those described with reference to FIGS. 4A to 4D. The detailed description of the process up to the formation of the first preliminary trench isolation layer 430 on the substrate 400 may be similar to the methods described with reference to FIGS. 4A to 4D.

The upper hard mask pattern 415a, the preliminary buffer insulating pattern 410, and the lower preliminary hard mask pattern 405 may be sequentially etched using the first preliminary trench isolation layer 430 as an etch mask to form an opening for exposing a region of the substrate 400. In this case, the preliminary buffer insulating pattern 410 and the lower preliminary hard mask pattern 405 may be sequentially etched to form a buffer insulating pattern 410a and a lower hard mask pattern 405a, respectively.

Subsequently, a second insulating spacer 510 is formed to cover sidewalls of the lower hard mask pattern 405a, the buffer insulating pattern 410a, and the first preliminary trench isolation layer 430 exposed by the opening. The second insulating spacer 510 may be formed of a material having an etch selectivity with respect to the substrate 400. For example, when the substrate 400 is formed of silicon, the second insulating spacer 510 may be formed of silicon oxide or silicon nitride.

The exposed substrate 400 is etched using the first preliminary trench isolation layer 430 and the second insulating spacer 510 as etch masks to form a second trench 520. Subsequently, a thermal oxide layer may be formed on an inner wall of the second trench 520.

A second preliminary trench isolation layer 530 is formed on the substrate having the second trench 520. The second preliminary trench isolation layer 530 may be formed of silicon oxide.

Referring to FIG. 5B, the first and second preliminary trench isolation layers 430 and 530 may be planarized to expose a top surface of the lower hard mask pattern 405a, so that first and second trench isolation layers 430a and 530a are formed to fill the first and second trenches 425 and 520, respectively. The planarization of the first and second preliminary trench isolation layers 430 and 530 may be performed, for example, by a CMP technique. The buffer insulating pattern 410a may be removed while the first and second preliminary trench isolation layers 430 and 530 are planarized.

The first and second trench isolation layers 430a and 530a may have top surfaces disposed on substantially the same plane as the top surface of the lower hard mask pattern 405a. In addition, the first and second trench isolation layers 430a and 530a may be formed within the field region of the substrate 400 to define the active region. Subsequently, the lower hard mask pattern 405a may be removed. Accordingly, the first and second trench isolation layers 430a and 530a may have the top surfaces higher than the top surface of the substrate 400.

In the meantime, the first and second insulating spacers 420a and 510 may remain on sidewalls of protrusions of the first and second trench isolation layers 430a and 530a having the top surfaces protruded from the substrate 400. That is, the first insulating spacer 420a remains to cover the sidewall of the protrusion of the first trench isolation layer 430a, and the second insulating spacer 510 remains to cover the sidewall of the protrusion of the second trench isolation layer 530a. As a result, the first and second insulating spacers 420a and 510 are formed on the substrate of the active regions adjacent to upper corners of the first and second trenches 425 and 520, so that characteristic degradation of devices which may occur in the upper corners of the first and second trenches 425 and 520 may be reduced. For example, when a metal oxide semiconductor (MOS) transistor is formed on the substrate of the active region by a subsequent process, instability of threshold voltage and/or parasitic current may be reduced or prevented from occurring at an interface region between the active region and the first and second trench isolation layers 430a and 530a.

As described above, according to some embodiments of the present invention, patterns may be formed which have a pitch smaller than that of a photoresist pattern which may be implemented by photolithography equipment using conventional processes. In addition, a trench isolation layer may be formed using the patterns having reduced pitch as masks, so that the width of an active region defined by the trench isolation layer may be reduced.

According to some embodiments of the present invention, methods of forming a fine pattern having a pitch smaller than that of a photoresist pattern which may be obtained using conventional photolithography techniques is provided. Further, a trench isolation layer may be formed using a fine pattern having a reduced pitch. As a result, the area of an active region defined by the trench isolation layer may be reduced. Furthermore, the trench isolation layers having a pitch smaller than the pitch of the photoresist pattern which may be obtained using conventional photolithography techniques, and the active regions defined thereby, may be formed. Accordingly, highly integrated semiconductor devices may be fabricated using conventional photolithography equipment without employing a new light source and corresponding photoresist material.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a trench isolation layer, comprising:
   forming masks having a first width and spaced apart from each other by a second width smaller than the first width on a substrate, each of the masks including a lower preliminary hard mask pattern, a preliminary buffer insulating pattern, and an upper preliminary hard mask pattern which are sequentially stacked on the substrate;
   forming first preliminary insulating spacers on sidewalls of the masks;
   etching the substrate using the upper preliminary hard mask patterns and the first preliminary insulating spacers as etch masks to form first trenches, predetermined regions of the first preliminary insulating spacers being etched to form first insulating spacers exposing sidewalls of the upper preliminary hard mask patterns during the formation of the first trenches;
   pulling back the upper preliminary hard mask patterns, thereby forming upper hard mask patterns on the preliminary buffer insulating patterns;
   forming a first preliminary trench isolation layer on the substrate having the upper hard mask patterns, the first preliminary trench isolation layer exposing top surfaces of the upper hard mask patterns;
   sequentially etching the upper hard mask patterns, the preliminary buffer insulating patterns disposed below the upper hard mask patterns, the lower preliminary hard mask patterns, and the substrate using the first preliminary trench isolation layer as an etch mask, thereby forming second trenches within the substrate;
   forming a second preliminary trench isolation layer on the substrate having the second trenches; and
   planarizing the first and second preliminary trench isolation layers, thereby forming first and second trench isolation layers filling the first and second trenches, respectively.

2. The method of claim 1, wherein forming the masks comprises:
   forming a lower hard mask layer, a buffer insulating layer, and an upper hard mask layer sequentially stacked on the substrate, the upper hard mask layer being formed of a material layer having an etch selectivity with respect to the buffer insulating layer;
   forming preliminary photoresist patterns having a first pitch on the upper hard mask layer;
   increasing widths of the preliminary photoresist patterns to thereby form photoresist patterns having a first width, the photoresist patterns being spaced apart from each other by a second width smaller than the first width;
   sequentially etching the upper hard mask layer, the buffer insulating layer, and the lower hard mask layer using the photoresist patterns as etch masks; and
   removing the photoresist patterns.

3. The method of claim 1, wherein forming the masks comprises:
   forming a lower hard mask layer, a buffer insulating layer, and an upper hard mask layer sequentially stacked on the substrate, the upper hard mask layer being formed of a material layer having an etch selectivity with respect to the buffer insulating layer;
   forming sacrificial masks having a first pitch on the upper hard mask layer, the sacrificial masks being formed of a material having an etch selectivity with respect to the upper hard mask layer;
   forming spacers on sidewalls of the sacrificial masks, layers including the sacrificial masks and the spacers having a first width and being spaced apart from each other by a second width smaller than the first width;
   etching the upper hard mask layer, the buffer insulating layer, and the lower hard mask layer using the sacrificial masks and the spacers as etch masks; and
   removing the sacrificial masks and the spacers.

4. The method of claim 1, wherein the first preliminary insulating spacers are formed of a material having an etch selectivity with respect to the upper preliminary hard mask patterns.

5. The method of claim 1, wherein the lower preliminary hard mask patterns and the upper preliminary hard mask patterns are formed of nitride layers.

6. The method of claim 5, wherein the first insulating spacer exposes sidewalls of the upper preliminary hard mask patterns while at least partially covering sidewalls of the lower preliminary hard mask patterns.

7. The method of claim 1, further comprising:
   after etching the upper hard mask patterns, the preliminary buffer insulating patterns, and the lower preliminary hard mask patterns using the first preliminary trench isolation layer as an etch mask,
   forming a second insulating spacer on the exposed sidewalls of the remaining lower preliminary hard mask patterns and the preliminary buffer insulating patterns as well as on the exposed sidewall of the first preliminary trench isolation layer.

8. The method of claim 7, wherein forming the first and second trench isolation layers comprises:
   planarizing the first and second preliminary trench isolation layers using a chemical mechanical polishing technique until a top surface of the remaining lower preliminary hard mask pattern is exposed.

9. The method of claim 8, wherein the first and second trench isolation layers comprise protrusions having top surfaces higher than a top surface of the substrate.

10. The method of claim 9, wherein the first and second insulating spacers remain to cover sidewalls of the protrusions of the first and second trench isolation layers, respectively, during the formation of the first and second trench isolation layers.

11. The method of claim 8, further comprising:

after the formation of the first and second trench isolation layers, removing the remaining lower preliminary hard mask pattern.

* * * * *